(12) United States Patent
Feng

(10) Patent No.: US 9,500,772 B2
(45) Date of Patent: Nov. 22, 2016

(54) METAFILM FOR LOSS-INDUCED SUPER-SCATTERING AND GAIN-INDUCED ABSORPTION OF ELECTROMAGNETIC WAVE

(71) Applicant: Simin Feng, Waldorf, MD (US)

(72) Inventor: Simin Feng, Waldorf, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/961,613

(22) Filed: Dec. 7, 2015

(65) Prior Publication Data

US 2016/0172816 A1   Jun. 16, 2016

Related U.S. Application Data

(60) Provisional application No. 62/090,590, filed on Dec. 11, 2014.

(51) Int. Cl.
*H01S 5/10* (2006.01)
*G02B 1/00* (2006.01)

(52) U.S. Cl.
CPC .............. *G02B 1/002* (2013.01); *H01S 5/1046* (2013.01); *Y10S 977/755* (2013.01); *Y10S 977/774* (2013.01)

(58) Field of Classification Search
CPC ..... G02B 1/002; G02B 1/005; H01S 5/1046; Y10S 977/755; Y10S 977/774
See application file for complete search history.

(56) References Cited

U.S. PATENT DOCUMENTS

| 7,328,305 | B2 | 2/2008 | Kleiman et al. | 711/114 |
| 7,921,257 | B1 | 4/2011 | Kleiman et al. | 711/114 |
| 2009/0219623 | A1* | 9/2009 | Shalaev | B82Y 20/00 359/642 |
| 2012/0019892 | A1* | 1/2012 | Bowers | G02B 1/005 359/276 |
| 2012/0063478 | A1* | 3/2012 | Park | H01S 5/1046 372/39 |
| 2013/0272335 | A1* | 10/2013 | Ghannam | B82Y 20/00 372/69 |
| 2015/0295379 | A1 | 10/2015 | Ozdemir et al. | H01S 3/06 |
| 2015/0364898 | A1* | 12/2015 | Meng | H01S 5/0425 372/40 |

OTHER PUBLICATIONS

Ghannam, "Quantum Properties of Light Emitted by Dipole Nano-Laser", Dissertation, Paper 866, (2007).*
C. M. Bender et al.: "Real Spectra in Non-Hermitian Hamiltonians having PT Symmetry", Phys Rev Lett 80 5243 (1998). http://journals.aps.org/prl/pdf/10.1103/PhysRevLett.80.5243 preprint: http://arxiv.org/pdf/physics/9712001v3.pdf.
C. M. Bender et al.: "Complex Extension of Quantum Mechanics", Phys Rev Lett 89 270401 (2002). http://journals.aps.org/prl/pdf/10.1103/PhysRevLett.89.270401 preprint: http://arxiv.org/pdf/quant-ph/0208076v2.pdf.

(Continued)

*Primary Examiner* — Eric Bolda
(74) *Attorney, Agent, or Firm* — Gerhard W. Thielman, Esq.

(57) ABSTRACT

A metafilm is provided for operating on a photon at a defined wavelength, for super-scattering, absorption, and for laser absorber switch. The metafilm includes dimers and a conductive substrate for embedding the dimers in an array. Each dimer comprises a pair of a gain element and a loss element. The substrate, and the gain and loss elements have complex permittivity values. The metafilm super-scatters (e.g., lases) the photon in response to increasing the imaginary component of either the substrate or the loss element, and absorbs the photon in response to increasing the imaginary component of the gain element.

22 Claims, 13 Drawing Sheets

(56) References Cited

OTHER PUBLICATIONS

S. Longhi: "Spectral singularities and Bragg scattering of complex crystles", *Phys Rev A* 81 022102 (2010). preprint: http://arxiv.org/pdf/1001.0962v1.pdf.

M. G. Moharam et al.: "Rigorous coupled-wave analysis of planar-grating diffraction", *J. Opt. Sci Am* 71 811 (1981). http://mitran-lab.amath.unc.edu:8081/subversion/PolymerPhotovoltaic/PhotonicAbsorption/biblio/Moharam1981.pdf.

D. J. Bergman et al.: "Surface Plasmon Amplification by Stimulated Emission of Radiation . . . ", *Phys Rev Lett* 90 (2) 027402 (2003). http://physics.gsu.edu/stockman//data/prl_90_027402_2003.pdf.

N. I. Zheludev et al.: "Coherent meta-materials and the lasing spacer", *Nature Photonics* 2 351-354 (2008). preprint: http://arxiv.org/pdf/0802.2519.pdf.

A. Mosdafazadeh: Resonance phenomenon related to spectral singularities, complex barrier potential, and resonating waveguides, *Phys Rev A* 80 032711 (2009). preprint: http://arxiv.org/pdf/0908.1713v3.pdf.

C. E. Rüter et al.: "Observation of parity-time symmetry in optics", *Nature Physics* 6 192-195 (2010). http://physics.technion.ac.il/~msegev/publications/Observation%20of%20parity-time%20symmetry%20in%20optics.pdf.

S. Feng: "Dissipation-Induced Super Scattering and Lasing PT-Spacer",(2015). http://arxiv.org/pdf/1503.00188v1.pdf.

\* cited by examiner

METAFILM FOR LOSS-INDUCED SUPER-SCATTERING AND GAIN-INDUCED ABSORPTION OF ELECTROMAGNETIC WAVE

CROSS REFERENCE TO RELATED APPLICATION

Pursuant to 35 U.S.C. §119, the benefit of priority from provisional application 62/090,590, with a filing date of Dec. 11, 2014, is claimed for this non-provisional application.

STATEMENT OF GOVERNMENT INTEREST

The invention described was made in the performance of official duties by one or more employees of the Department of the Navy, and thus, the invention herein may be manufactured, used or licensed by or for the Government of the United States of America for governmental purposes without the payment of any royalties thereon or therefor.

BACKGROUND

The invention relates generally to electromagnetic amplification. In particular, the invention involves substrate dissipation and an array of dimers in which a "dimer" is defined as a structure formed from a complementary pair of similar sub-units. Each dimer is composed of one loss element and one gain element. The loss and gain elements have the same geometry and the same real part of the permittivity, but the opposite imaginary part of the permittivity.

In a pioneering work, Bender and colleagues proved that non-Hermitian Hamiltonian with parity-time ($\mathcal{PT}$) symmetry may exhibit entirely real spectrum below a phase transition (symmetry breaking) point. See C. M. Bender et al.: Real Spectra in Non-Hermitian Hamiltonians having PT Symmetry", *Phys Rev Lett* 80 5243 (1998) and C. M. Bender et al.: "Complex Extension of Quantum Mechanics", *Phys Rev Lett* 89 270401 (2002). Inspired by this emerging concept, in the past decade there has been a growing interest in studying $\mathcal{PT}$-symmetric Hamiltonian in the framework of optics where the $\mathcal{PT}$ complex potential in quantum mechanics is translated into a complex electrical permittivity profile satisfying $\in(r)=\in^*(-r)$ in optical systems.

In optics, most of the $\mathcal{PT}$-symmetric structures are realized by parallel waveguides or media with alternating gain and loss either along or across the propagation direction. The periodic spatial modulation of gain and loss in photonics and plasmonics structures has led to many intriguing phenomena such as nonreciprocal light propagation and invisibility, power oscillations, coherent perfect absorptions, loss-induced transparency, nonreciprocal Bloch oscillations, optical switching, unidirectional tunneling, loss-free negative refraction, and laser absorbers.

The $\mathcal{PT}$-symmetric systems are a subset of open quantum systems for which the Hamiltonian is non-Hermitian, and the eigenvalues are complex in general. The unique properties associated with non-Hermitian Hamiltonian are exceptional points and spectral singularities, one being a branch point singularity associated with level repulsion and symmetry breaking. The existence of the exceptional point has been observed in microwave experiments. See S. Longhi: "Spectral singularities and Bragg scattering of complex crystals", *Phys Rev A* 81 022102 (2010), and M. G. Moharam et al.: "Rigorous coupled-wave analysis of planar-grating diffraction", *J Opt. Sci Am* 71 811 (1981). Spectral singularity is related to scattering resonance of non-Hermitian Hamiltonian and manifests itself as giant transmission and reflection with vanishing bandwidth. Exceptional points and spectral singularities possess interesting electromagnetic properties and have attracted much attention.

SUMMARY

Conventional schemes for electromagnetic amplification yield disadvantages addressed by various exemplary embodiments of the present invention. In particular, various exemplary embodiments provide a high gain metafilm for super-scattering, absorbing, and laser absorber switching. A metafilm is provided for operating on a photon at a wavelength, including an electrically conductive substrate, and a plurality of dimers. The substrate has a planar surface, a sub-wavelength thickness and a first complex permittivity. The dimers are disposed in a planar array on the planar surface. Each dimer has a sub-wavelength period and includes loss and gain elements separated by a sub-wavelength distance. Each element has a sub-wavelength span and a sub-wavelength width along said planar array. The loss element has a second complex permittivity. The gain element has a third complex permittivity.

The first, second and third complex permittivities respectively include first, second and third real components, and respectively include first, second and third imaginary components. The second and third real components are equal. The second imaginary component is higher than the third imaginary component. In response to increasing either the first imaginary component or the second imaginary component, the metafilm super-scatters the photon. In response to increasing the third imaginary component, the metafilm absorbs the photon. In response to increasing the third imaginary component the metafilm switches from photon release to photon absorption by increasing the third imaginary component. In response to increasing the secondary imaginary component, the metafilm switches from photon absorption to photon release.

BRIEF DESCRIPTION OF THE DRAWINGS

These and various other features and aspects of various exemplary embodiments will be readily understood with reference to the following detailed description taken in conjunction with the accompanying drawings, in which like or similar numbers are used throughout, and in which.

DETAILED DESCRIPTION

Figure 1:
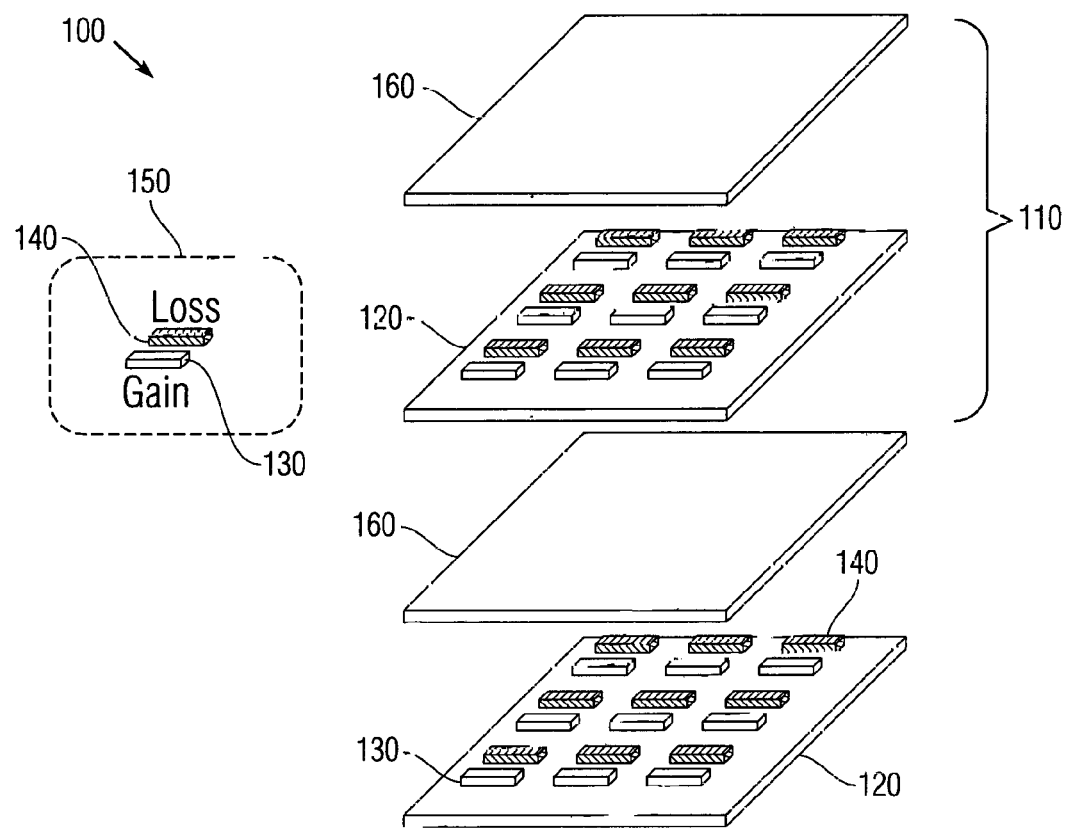
FIG. 1 is an isometric exploded view of fabrication of layers.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Exemplary embodiments provide techniques for $\mathcal{PT}$-symmetric loss-induced lasing (also called super-scattering) and gain-induced absorption, as described in "Loss-induced super-scattering and gain-induced absorption", accepted for publication in *Optics Express*. The term "loss" refers to dissipation from adjusting the imaginary portion of the permittivity that is greater than zero. The inventive concepts contrast with conventional processes for loss-induced absorption and gain-induced amplification.

Amplified transmission and reflection of a finite bandwidth are shown to occur at the same wavelength when the electromagnetic wave is incident on a periodic array of $\mathcal{PT}$-symmetric dimers embedded in a metallic film. Remarkably, this phenomenon vanishes if the metallic substrate is lossless while other parameters remain unchanged. When the metafilm is adjusted to the vicinity of a spectral singularity, tuning substrate dissipation to a critical value can lead to supper scattering in stark contrast to that expected in conventional systems.

The $\mathcal{PT}$-synthetic plasmonic metafilm acts as a lasing $\mathcal{PT}$-spaser: a planar source of coherent radiation. The metallic dissipation provides means to couple light out of the dark modes of the $\mathcal{PT}$-spaser. Above a critical gain/loss coupling, the metafilm behaves as a meta-gain medium (with the meta-gain atoms) composed from $\mathcal{PT}$-plasmonic dimers. This phenomenon implies that super radiation is possible from a cavity that has gain elements by tuning the cavity dissipation to a critical value. Another technique for enabling the $\mathcal{PT}$-synthetic plasmonic metafilm to become a laser is by tuning the loss element of the dimers near the exceptional point (EP). The $\mathcal{PT}$-synthetic plasmonic metafilm can also become an absorber by tuning the gain element of the dimers near the EP. Similarly, the $\mathcal{PT}$-synthetic plasmonic metafilm can also become a laser absorber switch by tuning the loss and gain elements near the EP.

Parity-time synthetic materials represent a novel class of metamaterials with novel electromagnetic properties arising from a delicate balance between loss and gain elements. Global $\mathcal{PT}$-symmetry is a demanding condition. Systems with local $\mathcal{PT}$-symmetry are easier to implement than global. An array of $\mathcal{PT}$-symmetric dimers in which each gain/loss pair possesses local $\mathcal{PT}$-symmetry with respect to its own center enables emission in the real spectrum in the desired parameter region. Except for compensating loss with gain, active plasmonic materials offer an ideal platform for studying non-Hermitian Hamiltonian in the electromagnetic domain at the sub-wavelength scale.

Most studies on $\mathcal{PT}$-symmetric structures employ analytical models based on either one-dimensional scalar Helmholtz equation or two-dimensional scalar paraxial wave equation. For plasmonic metamaterials having sub-wavelength "meta-atoms" as resonators, the above analytical descriptions are not applicable. Nevertheless, the plasmonic metafilms are complex quantum systems with strong coupling and in general can be described by non-Hermitian Hamiltonian.

The spaser concept proposed by Bergman et al. in "Surface Plasmon Amplification by Stimulated Emission of Radiation", *Phys Rev Lett* 90 (2) 027402 has led to Zheludev et al. in "Lasing Spacer", *Nature Photonics* 2, 351-354 suggesting "lasing spaser" fueled from the dark modes of the spaser via structural symmetry breaking. Experiments towards this concept have been reported. This disclosure examines electromagnetic properties of $\mathcal{PT}$-synthetic plasmonic metafilm, which is composed of a planar array of coupled $\mathcal{PT}$-symmetric dimers. The exemplary structure can exhibit the super-scattering effect by control of plasmonic substrate dissipation in both forward and backward directions. Steering the metafilm to the vicinity of a singular region of the system while tuning the substrate dissipation to a critical value can produce substantially amplified waves radiated from both sides of the metafilm. The exemplary device behaves as a lasing $\mathcal{PT}$-spaser. The large gain is drawn from the dark modes of the $\mathcal{PT}$-spaser via metallic dissipation, which breaks the $\mathcal{PT}$ symmetry and couples light out of the $\mathcal{PT}$-spaser.

FIG. 1 shows an isometric exploded schematic view 100 of a unit structure 110 in a planar sub-wavelength periodic square array of unit cells composed of gain/loss elements embedded in an ultra-thin electrically conductive metafilm 120 on which are disposed gain elements 130 and loss elements 140, a pair of which form a gain/loss pair or dimer 150. The term ultra-thin means thickness being at least two orders of magnitude smaller than the planar dimensions (i.e., orthogonal to the thickness). The term "dimer" is commonly employed in microbiology. The gain/loss dimer 150 repeats in the x-y plane of the metallic film 120. A dielectric layer 160 can be disposed over the metafilm 120 and dimers 150, and the unit 110 structure can be concatenated in stacks.

The plasmonic metafilm 120 satisfies the local $\mathcal{PT}$ symmetry with respect to the x directions, i.e., $$\in(x,y,z)=\in^*(-x,y,z) \qquad (1)$$

for $\Delta x/2 < |x| < b + \Delta x/2$, where $\Delta x$ is separation distance between the elements. This structure 110 cannot be described by the paraxial wave equation due to the abrupt change of electromagnetic (EM) field at the metal-dielectric interfaces. Maxwell's equations are numerically solved based on rigorous coupled-wave analysis. Numerical approaches can handle more complicated structures and guide engineering designs to search for the appropriate parameter combination. This is important for practical implementation of the extraordinary properties predicted by analytical theory.

Theoretical Approach: In view 100, a $\mathcal{PT}$-symmetric dimer 150 represents a unit cell composed of gain 130 and loss 140 sub-wavelength elements embedded within the thin metafilm 120. The dimers 150 and the metafilm 120 have the same thickness, i.e., the metallic mesh is filled with gain/loss elements. The unit cell repeats in the x-y plane with the same period in both directions to form the array.

The dimer elements 130 and 140 have complex permittivity values, as does the metafilm 120. The real coefficient $\in'$ of the relative permittivity of the loss and gain elements is fixed at 3.6 throughout the disclosure. The imaginary coefficient $\in''$ varies, but satisfies:

$$\in''_{gain} = -\in''_{loss} \tag{2}$$

to ensure the local $\mathcal{PT}$-symmetry. The permeability is unity ($\mu=1$) for all the materials. The period p=3.5 µm, the dimer length a=2.5 µm and width b=1.0 µm are fixed throughout the disclosure. However, the device functions are not limited by these values, which merely provide an example for demonstration. The general expression of the complex conjugate permittivity for the gain and loss elements is given by:

$$\in = \in' + i\in'' \tag{3}$$

is such that the condition $\in''>0$ represents the loss element, and $\in''<0$ represents the gain element. The incidence wave is p-polarized with the electric field parallel to the x-z plane. Bender relates this as: P:x→x, p→−p. T:x→x, p→−p, i→−i, followed by eqn. (4).

For infrared $\mathcal{PT}$-synthetic materials, the dispersion of metal, aluminum (Al) in this case, cannot be neglected. For a harmonic time dependence as exp(−iωt) for electromagnetic field, the permittivity of Al was obtained by curve-fitting experimental data with a Drude model:

$$\varepsilon_m = 1 - \frac{\omega_p^2}{\omega^2 + i\gamma\omega}, \tag{4}$$

where "plasma frequency" $\omega_p=9.38$ µm$^{-1}$, and damping constant $\gamma=0.048$ µm$^{-1}$. Without plasmonic loss, this reduces to a real value for Al:

$$\in_m = \mathfrak{R}(\in_{Al}). \tag{5}$$

Other metals for the metafilm's substrate can be considered, such as gold (Au), silver (Ag), copper (Cu), palladium (Pd) and tungsten (W). Alternatively, the metafilm 120 can incorporate a transparent composite material such as indium tin oxide and aluminum zinc oxide.

Maxwell's equations can be recast in a Schrödinger-type form:

$$i\frac{\partial}{\partial z}\begin{pmatrix} E_t \\ \hat{z} \times H_t \end{pmatrix} = \tilde{H} \cdot \begin{pmatrix} E_t \\ \hat{z} \times H_t \end{pmatrix}, \tag{6}$$

where E is electric field intensity, H is the magnetic field intensity, $\tilde{H}$ is the Hamiltonian, the subscript "t" refers to the transverse (x; y) components of the EM field on the metasurface, and $\hat{z}$ is the unit vector along the z direction.

The Hamiltonian is given by:

$$\tilde{H} = \begin{pmatrix} 0 & k_0\mu_t \hat{I}_t + \frac{1}{k_0}\nabla_t \frac{1}{\varepsilon_t}\nabla_t \\ k_0\varepsilon_t \hat{I}_t + \frac{1}{k_0}\hat{z}\times\nabla_t \frac{1}{\mu_z}\hat{z}\times\nabla_t & 0 \end{pmatrix}, \tag{7}$$

where dispersion wavenumber $k_0=\omega/c$, and the c is the speed of light in vacuum. The subscript "z" refers to the component in the z direction, in which $$\hat{I}_t = \hat{I} - \hat{z}\hat{z} \tag{8}$$

is the two-dimensional unit dyadic; and the nabla operator is:

$$\nabla_t \equiv \hat{x}\frac{\partial}{\partial x} + \hat{y}\frac{\partial}{\partial y}. \tag{9}$$

The form of eqn. (7) can handle uniaxial anisotropic materials with the optical axis along the z direction. The Hamiltonian given by eqn. (7) is non-Hermitian. The scattering and transfer matrices $|\Psi\rangle$ and $|\Psi_t\rangle$ respectively, as well as the transmittance and the reflectance are calculated numerically. The transfer matrix, which connects the field at the output and the input surfaces, is defined as:

$$|\Psi_i\rangle \equiv \begin{pmatrix} M_{11} & M_{12} \\ M_{21} & M_{22} \end{pmatrix}|\Psi_o\rangle, \tag{10}$$

where $M_{11}$, $M_{12}$, $M_{21}$ and $M_{22}$ are matrix elements, the subscripts "o" and "i" refer to the EM field at the output and input surfaces, respectively; and the scattering matrix is:

$$|\Psi\rangle \equiv \begin{pmatrix} E_t \\ \hat{z} \times H_t \end{pmatrix}. \tag{11}$$

The relationship between the transfer and scattering matrices in this case is given by the relations:

$$S_{11} = M_{21}M_{11}^{-1} \tag{12}$$

$$S_{21} = M_{11}^{-1} \tag{13}$$

$$S_{22} = -M_{11}^{-1}M_{12} \tag{14}$$

$$S_{12} = M_{22} - M_{21}M_{11}^{-1}M_{12}, \tag{15}$$

where the $S_{11}$ and $S_{21}$ are, respectively, the reflection and transmission coefficients of the electric field. Note that reflection involves eqn. (12), and transmission involves eqn. (13). The relative permittivity of the loss/gain dielectric materials: $\in_r = 3.6(1\pm i0.06)$ is a complex conjugate.

In general, the transfer and scattering matrices are multidimensional due to multiple scattering channels. Extensive numerical studies have confirmed that for the exemplary geometry the magnitudes of the higher order and cross-polarization scatterings are much smaller than that of the first order event due to the sub-wavelength nature of the films. Therefore, the transfer and scattering matrices can be reduced to 2×2 matrices. The problem can be effectively described in a two-dimensional space.

The eigenvalues of the transfer matrix $|\Psi_t\rangle$ are given by:

$$\eta'_\pm = \frac{M_{11} \pm M_{22}}{2} \pm \sqrt{\left(\frac{M_{11} \pm M_{22}}{2}\right)^2 - 1}. \tag{16}$$

Here, the matrix element identity:

$$\det(M) = 1, \tag{17}$$

has been used, being numerically validated under various conditions. From eqn. (16), one obtains for the transfer eigenvalues:

$$|\eta_+^t \eta_-^t| = 1, \qquad (18)$$

which has been numerically tested for various parameters.

The symmetry of the structure requires the relationship:

$$S_{21} = S_{12}, \qquad (19)$$

and $$M_{12} = -M_{21}. \qquad (20)$$

A bi-orthogonality test for the eigenvectors can be written:

$$\langle \psi_+^l | \psi_-^r \rangle = \langle \psi_-^l | \psi_+^r \rangle = 0. \qquad (21)$$

These two conditions have also been confirmed numerically under various conditions. By using these conditions, the eigenvalues of the scattering matrix can be derived as:

$$\eta_\pm^s = \frac{M_{21} \pm 1}{M_{11}}. \qquad (22)$$

The transfer and scattering matrices and their eigenvalues are useful tools for the analysis of the spectral singularities. The eigenfunctions of the non-Hermitian Hamiltonian satisfy bi-orthogonal relationship. The right-hand eigenvectors of the transfer matrix are given by:

$$|\Psi_\pm^r\rangle = \begin{pmatrix} \frac{\eta_\pm^t - M_{22}}{M_{21}} \\ 1 \end{pmatrix}, \qquad (23)$$

and the left-hand eigenvectors are:

$$|\Psi_\pm^l\rangle = \begin{pmatrix} \frac{\eta_\pm^t - M_{22}}{M_{12}} & 1 \end{pmatrix}. \qquad (24)$$

The right and left eigenvectors satisfy the bi-orthogonal relationship provided by eqn. (21). Above bi-orthogonality has been numerically verified under various conditions. The transfer and scattering matrices with their eigenvalues and eigenvectors are useful tools for the analysis of exceptional points and spectral singularities.

Figure 2:
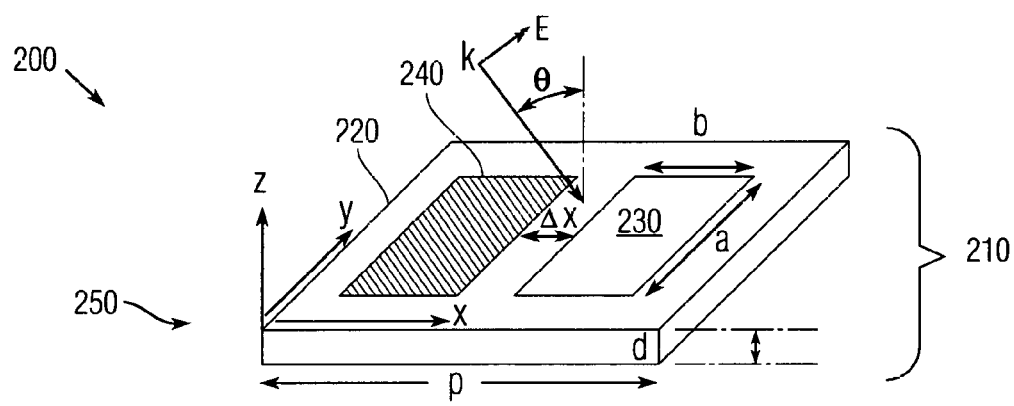
FIG. 2 is an isometric view of a single cell.

FIG. 2 shows an isometric view 200 of a unit cell 210. An electrically conductive substrate 220 having mesh thickness d has gain and loss elements 230 and 240 disposed thereon separated by distance Δx and having surface dimensions of a and b (respective span and width) along the x-y plane of the local coordinate system 250. The metafilm 120 constitutes the conductive substrate 220 with the dimers 150 disposed as an array therein along planar surface. The substrate 220 can be a metal, such as aluminum or a transparent composite, and preferably flexible. The gain elements can be quantum dots or quantum wells. The loss elements can be formed from a natural dielectric material or a composite dielectric material.

Many parameters can be changed regarding the geometry of the cell 210. In exemplary embodiments, the period (p=3.5 μm) of the square array, the size (a×b=2.5×1.0 μm$^2$) of the dimers 150, and the real part of the relative permittivity ($\in_r$=3.6) of the dimers 150 are fixed throughout the disclosure at values shorter than the wavelength λ of the light emitted or absorbed, and thus have sub-wavelength dimensions. The electric field E is shown incident at angle θ to the x-y plane.

Figure 3:
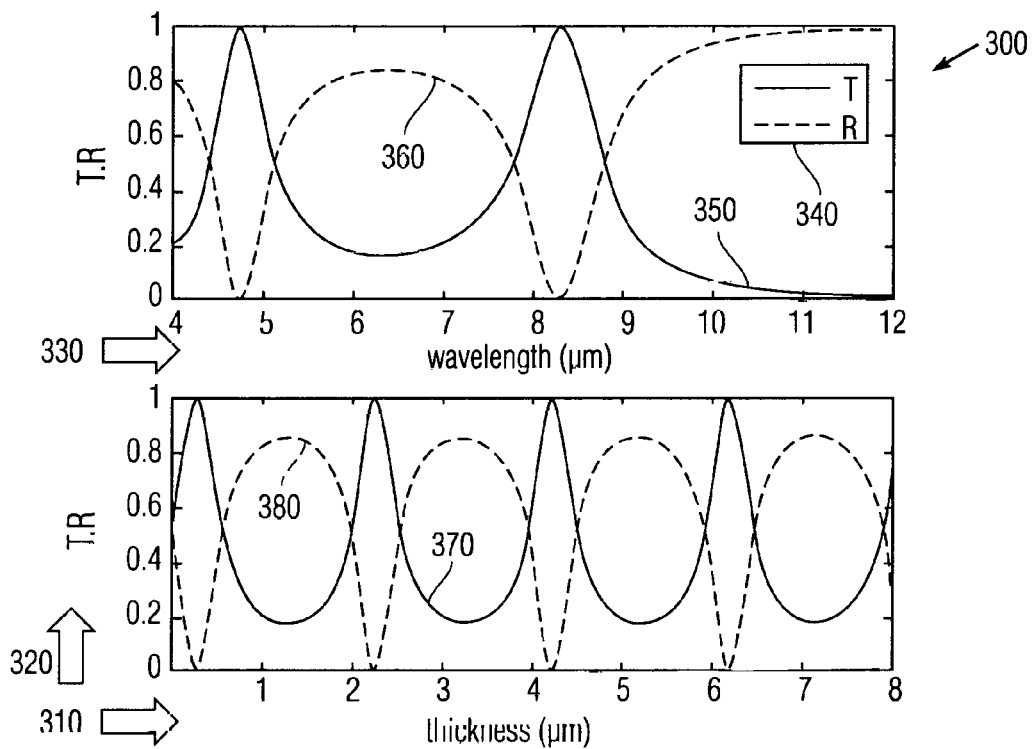
FIG. 3 is a graphical view of device performance without loss.

FIG. 3 shows a graphical view 300 of transmittance and reflectance with changes in thickness and wavelength. The first abscissa 310 denotes thickness (micrometers) and the ordinate 320 denotes transmittance and reflectance, while the second abscissa 330 denotes wavelength (nanometers). A legend 340 identifies solid lines as transmittance and dash lines as reflectance. These variations show mirrored alternating responses both in wavelength 330 for transmittance 350 and reflectance 360, and in thickness 310 for transmittance 370 and reflectance 380.

Transmittance 350 and reflectance 360 of the normal incidence wave on a lossless metafilm 120 are plotted versus wavelength 330 (in the upper panel or graph) and thickness 310 (in the lower panel) with the electric field E parallel to the shorter edge of the dimers 150. The separation of the two dimers Δx=0.5 μm for both cases. The thickness is d=1.5 μm of the substrate 220 for the upper panel, and the wavelength is λ=6 μm for the lower panel. The relative permittivity of the dimers 150 is real and given by $\in_r$=3.6, corresponding to the value for aluminum.

Figure 4:
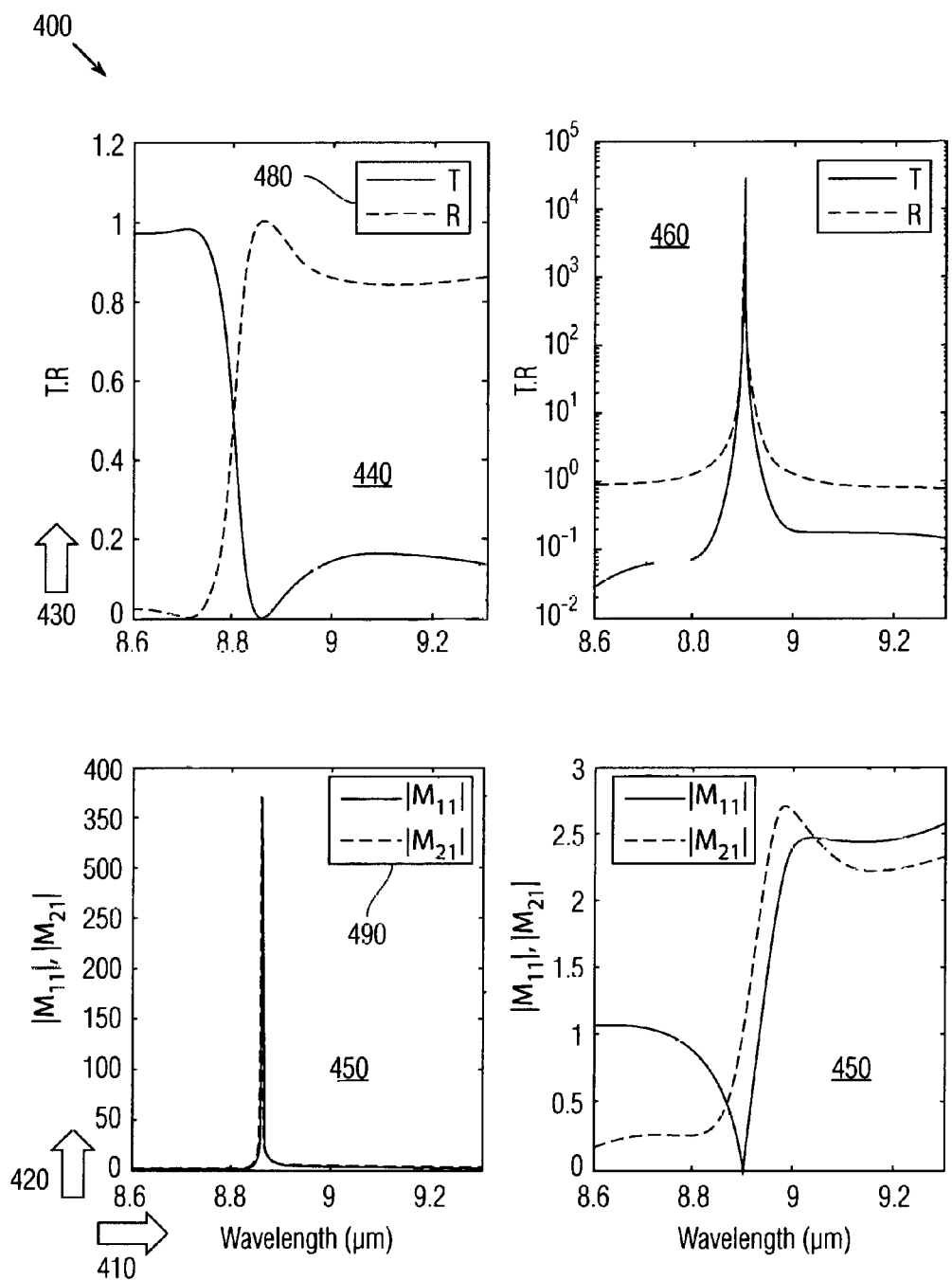
FIG. 4 is a graphical view of device performance with wavelength.

FIG. 4 shows a graphical view 400 of transmission and reflection variation with wavelength λ for different substrate dissipation values. The abscissa 410 denotes wavelength (micrometers) for all four panels, the first ordinate 420 denotes magnitude of the dimensionless transfer matrix elements for the lower panels, and the second ordinate 430 denotes transmittance and reflectance amplitude for the upper panels. The upper left panel 440 provides amplitude variation curves (solid and dash respectively) for zero substrate dissipation. The lower left panel 450 provides the magnitude of the transfer matrix element curves for $|M_{11}|$ and $|M_{21}|$ (solid and dash respectively) in panel 440. Similarly, the upper right panel 460 provides amplitude variation curves for non-zero substrate dissipation. Also, the lower right panel 470 provides the magnitude of the transfer matrix element curves for $|M_{11}|$ and $|M_{21}|$ in panel 460. Legends 480 and 490 identify the curves for the upper 440, 460 and lower 450, 470 panels respectively.

Figure 5:
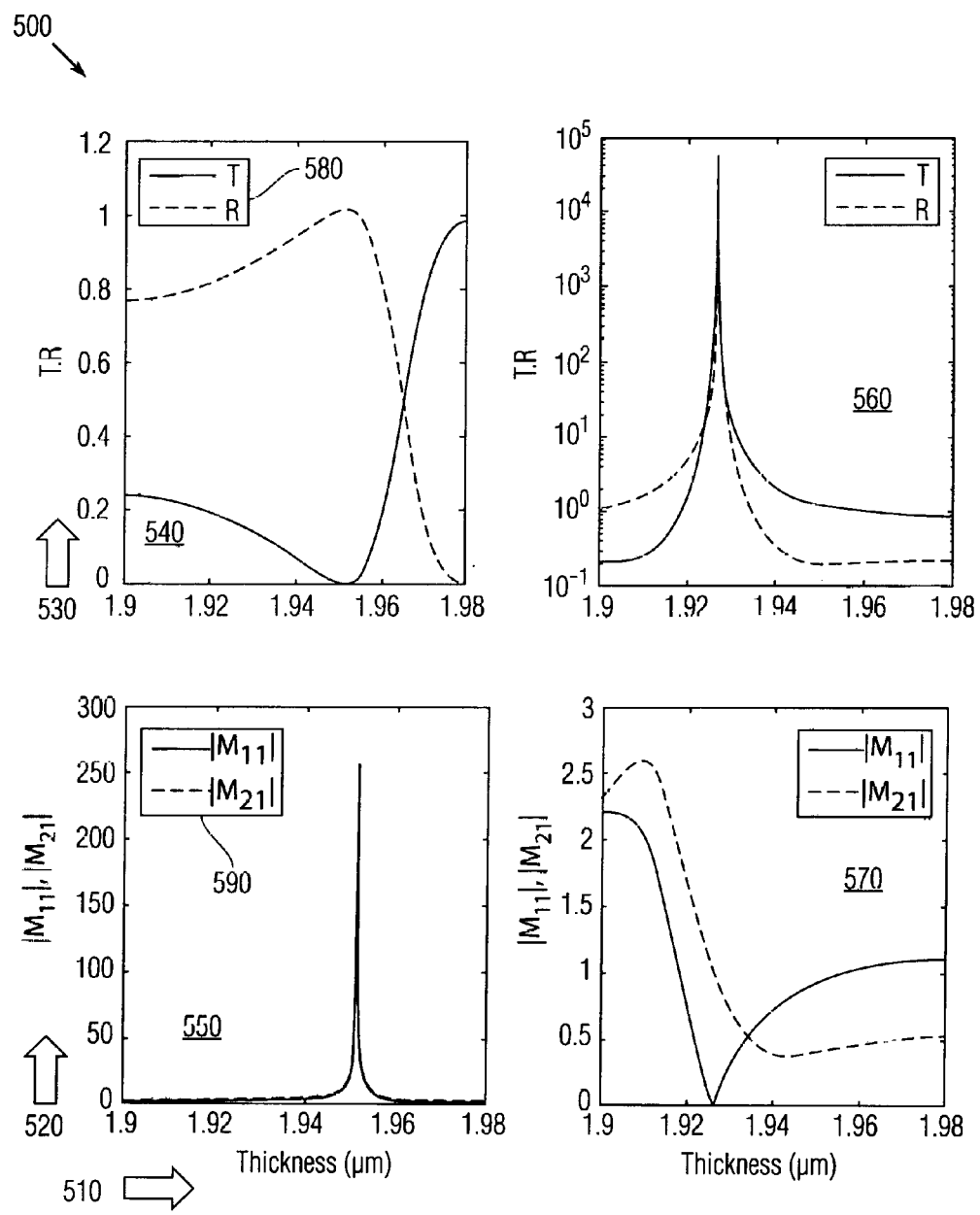
FIG. 5 is a graphical view of device performance with thickness.

FIG. 5 shows a graphical view 500 of reflectivity variation with metafilm thickness d for different substrate dissipation values. The abscissa 510 denotes thickness (micrometers) for all four panels, the first ordinate 520 denotes the magnitude of the dimensionless transfer matrix elements for the lower panels, and the second ordinate 530 denotes amplitude of the transmittance and reflectance for the upper panels. The upper left panel 540 provides amplitude variation curves (solid and dash respectively) for zero substrate dissipation. The lower left panel 550 provides the magnitude of the transfer matrix element curves for $|M_{11}|$ and $|M_{21}|$ curves (solid and dash respectively) in panel 540. Similarly, the upper right panel 560 provides transmittance and reflectance variation curves for non-zero substrate dissipation. Also, the lower right panel 570 provides the magnitude of the transfer matrix element curves for $|M_{11}|$ and $|M_{21}|$ in panel 560. Legends 580 and 590 identify the curves for the upper 540, 560 and lower 550, 570 panels respectively.

Transmittance and reflectance simulations without substrate dissipation in upper left panels 440 and 540 differ from transmittance and reflectance simulations with such metallic substrate dissipation in upper right panels 460 and 560. Without dissipation, variations mirror each other along a range of about an order of magnitude. With dissipation, both transmittance and reflectance spike at wavelength of 8.9 μm and thickness of 1.927 μm. The transfer matrix magnitudes without dissipation in lower left panels 450 and 550 show a spike for both values at wavelength of 8.86 μm and thickness of 1.952 μm, while with dissipation in the lower right panels 470 and 570 the $|M_{11}|$ magnitude reduces to zero for wavelength at 8.9 μm and thickness at 1.926 μm, and the $|M_{21}|$ magnitude approaches a minimum beyond a wavelength of about 9.1 μm and a thickness of about 1.94 μm.

Upper panels 540 and 560 show transmittance (solid) and reflectance (dash) versus the thickness 510 of the metafilm 120 at the wavelength (λ=6 μm) that corresponds to the normal incidence with the electric field parallel to the shorter edge of the dimers 150. The corresponding analysis of the transfer matrix elements is provided in the lower panels 550 and 570. The separation of the two elements is Δx=0.5 μm. The relative permittivity values of the loss 140 and gain 130 elements are complex and respectively expressed (with plus and minus imaginary components) as: $\in_r = 3.6(1 \pm i0.056)$.

Figure 6:
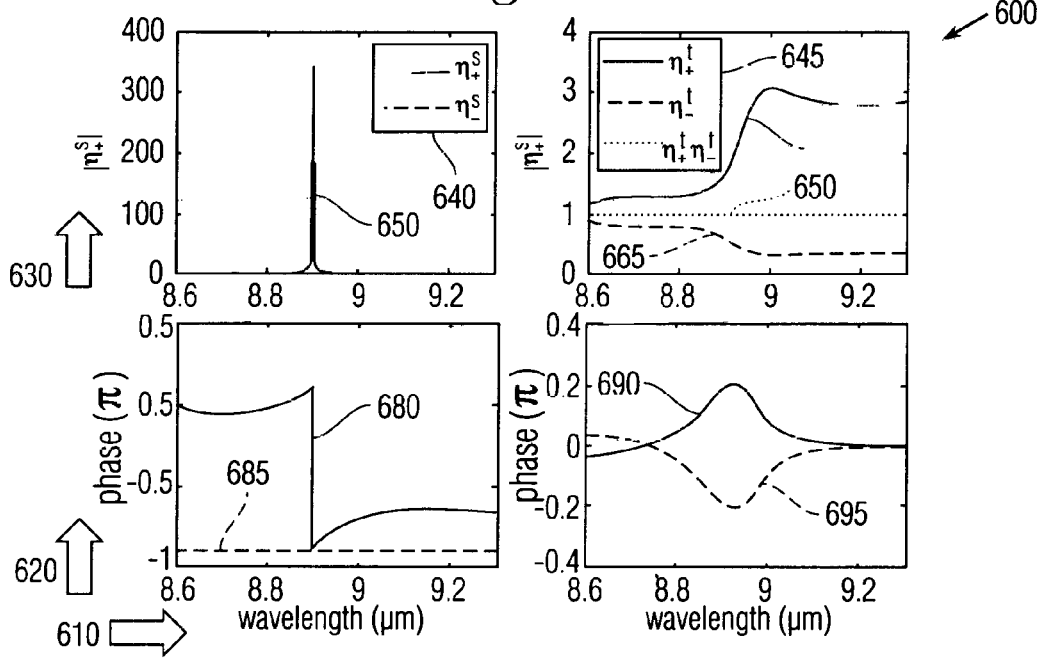
FIG. 6 is a graphical view of eigenvalue behavior.

FIG. 6 shows a graphical view 600 of eigenvalue variation with wavelength. The abscissa 610 denotes wavelength (micrometers) and the first ordinate 620 denotes phase for the lower panels, while the second ordinate 630 denotes the eigenvalue magnitude for the upper panels, which include legends 640 and 645 that identify the positive subscripts with solid lines and the negative subscripts with dash lines. Magnitudes of scattering matrix eigenvalues $\eta_+^s$ and $\eta_-^s$ are shown in the response curve 650 in the upper left panel. Magnitudes of transfer matrix eigenvalues values $\eta_+^t$ (above unity) and $\eta_-^t$ (below unity) are shown in their respective response curves 660 and 665, with their product shown as the dotted line 670 in the upper right panel.

The lower left panel illustrates the phases for scattering matrix eigenvalues 680 and 685. The upper right panel illustrates the phases for transfer matrix eigenvalues 690 and 695. These correspond to the condition of FIG. 4. The eigenvalues of the scattering matrix diverges with a phase jump (solid) at the wavelength 8.92 μm where the super-scattering occurs.

Figure 7:
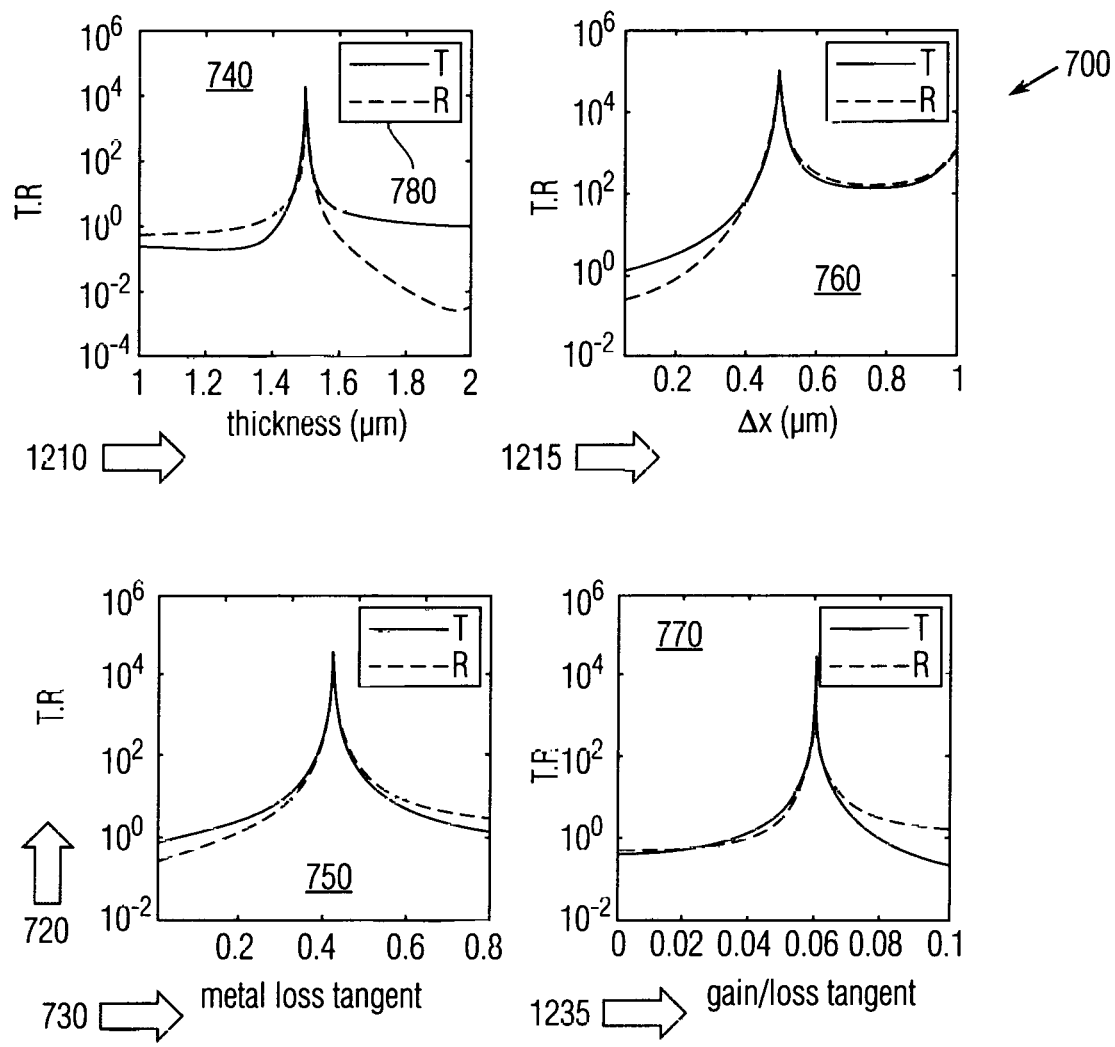
FIG. 7 is a graphical view of transmission and reflection for $\lambda=8.901$ μm.
Figure 8:
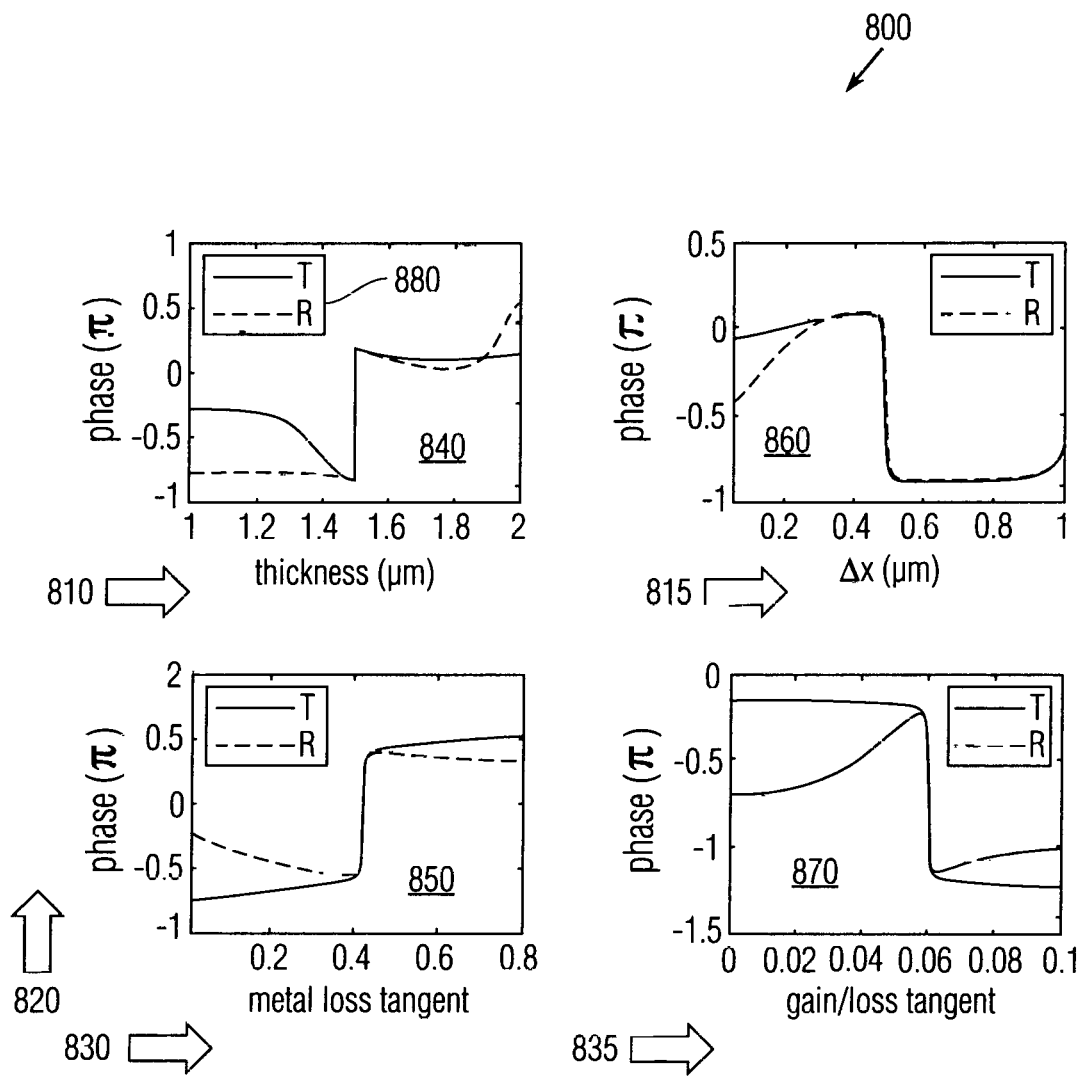
FIG. 8 is a graphical view of electric field phase change for $\lambda=8.901$ μm.

Sensitivity of super-scattering for amplitude and phase for transmittance and reflectance at wavelength λ=8.901 μm can be respectively denoted in FIGS. 7 and 8 plots in relation to other parameters: thickness, separation, metal loss tangent and gain/loss tangent. FIG. 7 shows a graphical view 700 of transmittance and reflectance amplitude variations for the various parameters. The first abscissa 710 denotes thickness d (micrometers), and the second abscissa 715 denotes separation distance Δx (micrometers) of the gain and loss dimer dielectric elements 230 and 240 in the upper panels. The ordinate 720 denotes amplitude for all four panels.

The third abscissa 730 denotes metal loss tangent, and the fourth abscissa 735 denotes gain/loss tangent in the lower panels. The upper left panel 740 shows variation in amplitude 720 with respect to thickness 710. The lower left panel 750 shows this with respect to metal loss tangent 730. The upper right panel 760 shows this with respect to dimer element separation 715. The lower right panel 770 shows this with respect to dimer dielectric gain/loss tangent 735. A legend 780 identifies the transmittance by solid lines and reflectance by dash lines. In particular, transmittance (solid) and reflectance (dash) at the wavelength 8.92 μm are shown as varying with thickness in panel 740, dimer separation 760, metal loss tangent 750, and dimer loss tangent 770. Other parameters are the same as those in FIG. 4. The plotted curves show amplitude peaks at 1.50 μm thickness, 0.51 μm separation, 0.42 metal loss tangent and 0.061 dielectric tangent.

FIG. 8 shows a graphical view 800 of phase variations. The first abscissa 810 denotes thickness d (micrometers), and the second abscissa 815 denotes gain/loss element separation distance Δx (micrometers) in the upper panels. The ordinate 820 denotes phase for all four panels. The third abscissa 830 denotes metal loss tangent, and the fourth abscissa 835 denotes dimer dielectric gain/loss tangent in the lower panels. The upper left panel 840 shows variation in phase 820 with respect to thickness 810. The lower left panel 850 shows this with respect to metal loss tangent 830. The upper right panel 860 shows this with respect to the gain/loss element separation 815. The lower right panel 870 shows this with respect to gain/loss tangent 835. A legend 880 identifies phase variation curves for transmittance by solid lines and reflectance by dash lines. The plotted curves show phase inflections at 1.50 μm thickness, 0.49 μm separation, 0.43 metal loss tangent and 0.061 dielectric tangent.

Figure 9:
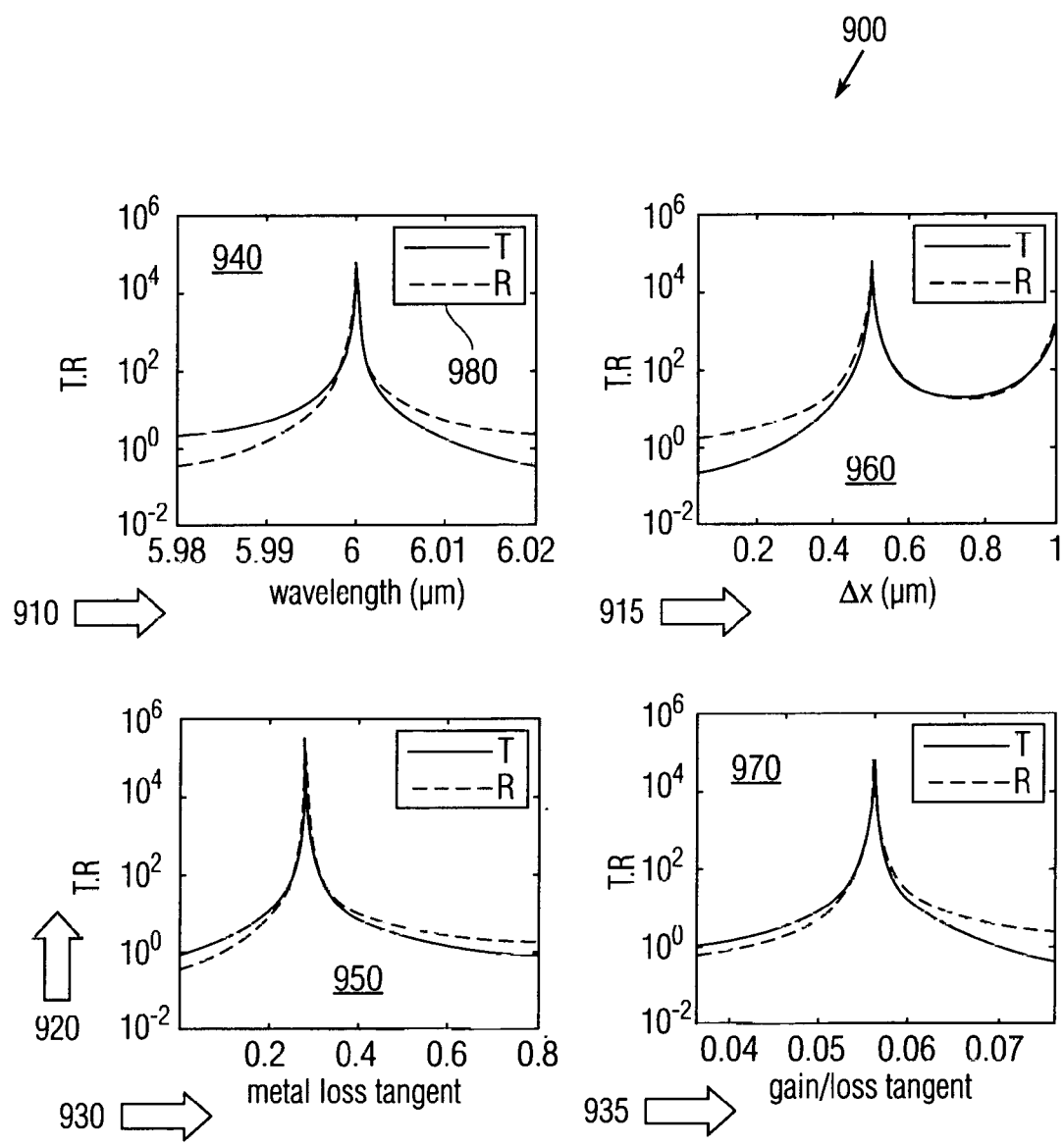
FIG. 9 is a graphical view of transmission and reflection for $d=1.927$ μm.
Figure 10:
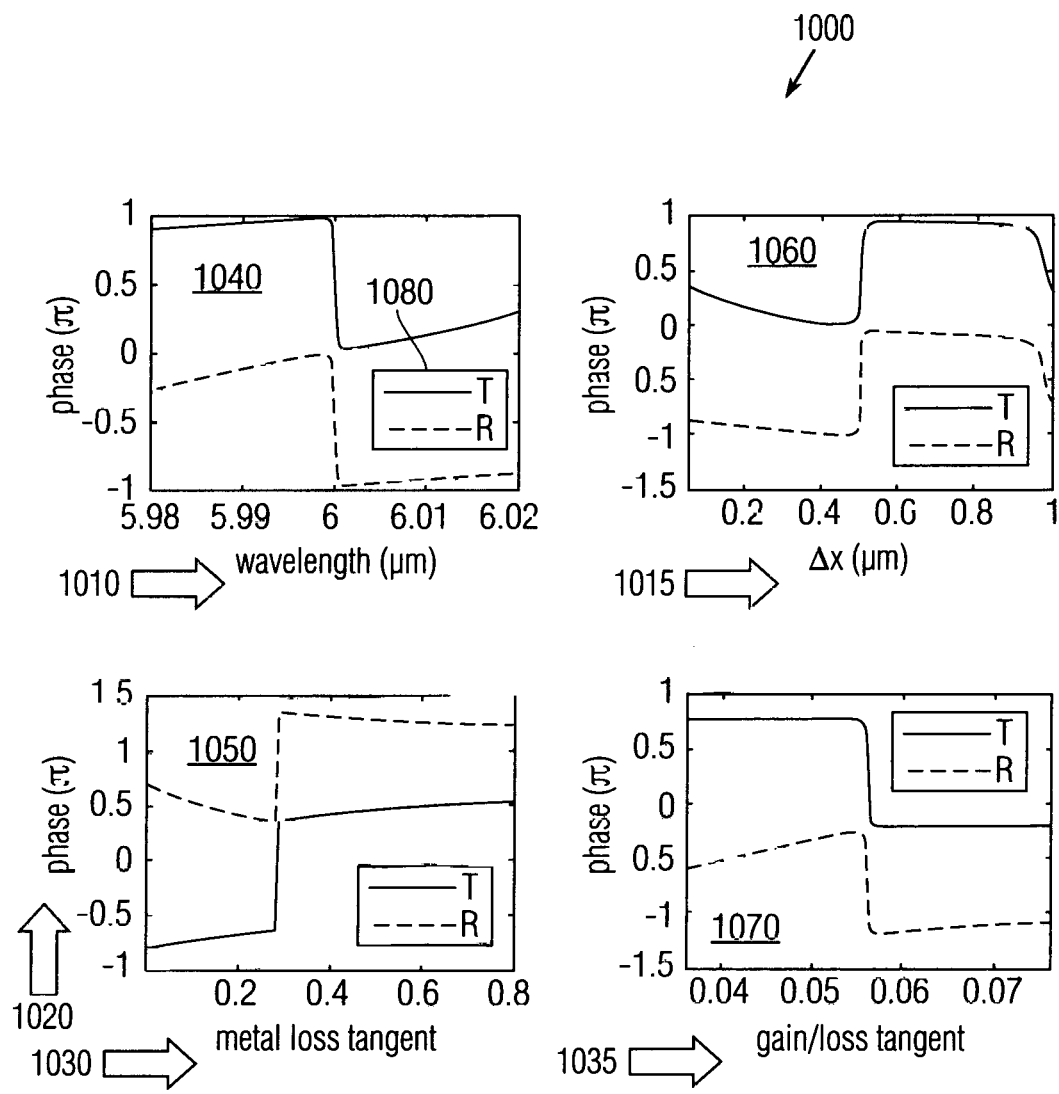
FIG. 10 is a graphical view of electric field phase change for $d=1.927$ μm.

Sensitivity of super-scattering for amplitude and phase at thickness d=1.927 μm can be respectively denoted in FIGS. 9 and 10 plots in relation to other parameters: wavelength, separation, metal loss tangent and gain/loss tangent. FIG. 9 shows a graphical view 900 of transmittance and reflectance amplitude variations for the various parameters. The first abscissa 910 denotes wavelength λ (micrometers), and the second abscissa 915 denotes separation distance Δx (micrometers) of the gain and loss dimer dielectric elements 230 and 240 in the upper panels. The ordinate 920 denotes amplitude for all four panels.

The third abscissa 930 denotes metal loss tangent, and the fourth abscissa 935 denotes gain/loss tangent in the lower panels. The upper left panel 940 shows variation in amplitude 920 with respect to wavelength 910. The lower left panel 950 shows this with respect to metal loss tangent 930. The upper right panel 960 shows this with respect to the gain/loss dimer element separation 915. The lower right panel 970 shows this with respect to dielectric gain/loss tangent 935. A legend 980 identifies the transmittance by solid lines and reflectance by dash lines. In particular, transmittance (solid) and reflectance (dash) at the wavelength 8.92 μm are shown as varying with wavelength in panel 940, dimer separation 960, metal loss tangent 950, and dimer loss tangent 970. Other parameters are the same as those in FIG. 4. The plotted curves show amplitude peaks at 6.001 μm wavelength, 0.51 μm separation, 0.29 metal loss tangent and 0.056 dielectric tangent.

FIG. 10 shows a graphical view 800 of phase variations. The first abscissa 1010 denotes wavelength λ (micrometers), and the second abscissa 1015 denotes gain/loss element separation distance Δx (micrometers) in the upper panels. The ordinate 1020 denotes phase for all four panels. The third abscissa 1030 denotes metal loss tangent, and the fourth abscissa 1035 denotes gain/loss tangent in the lower panels. The upper left panel 1040 shows variation in phase 1020 with respect to wavelength 1010. The lower left panel 1050 shows this with respect to metal loss tangent 1030. The upper right panel 1060 shows this with respect to the gain/loss element separation 1015. The lower right panel 1070 shows this with respect to gain/loss tangent 1035. A legend 1080 identifies phase variation curves for transmittance by solid lines and reflectance by dash lines. The plotted curves show phase inflections at 6.0 μm wavelength, 0.51 μm separation, 0.28 metal loss tangent and 0.056 dielectric tangent.

Figure 11:
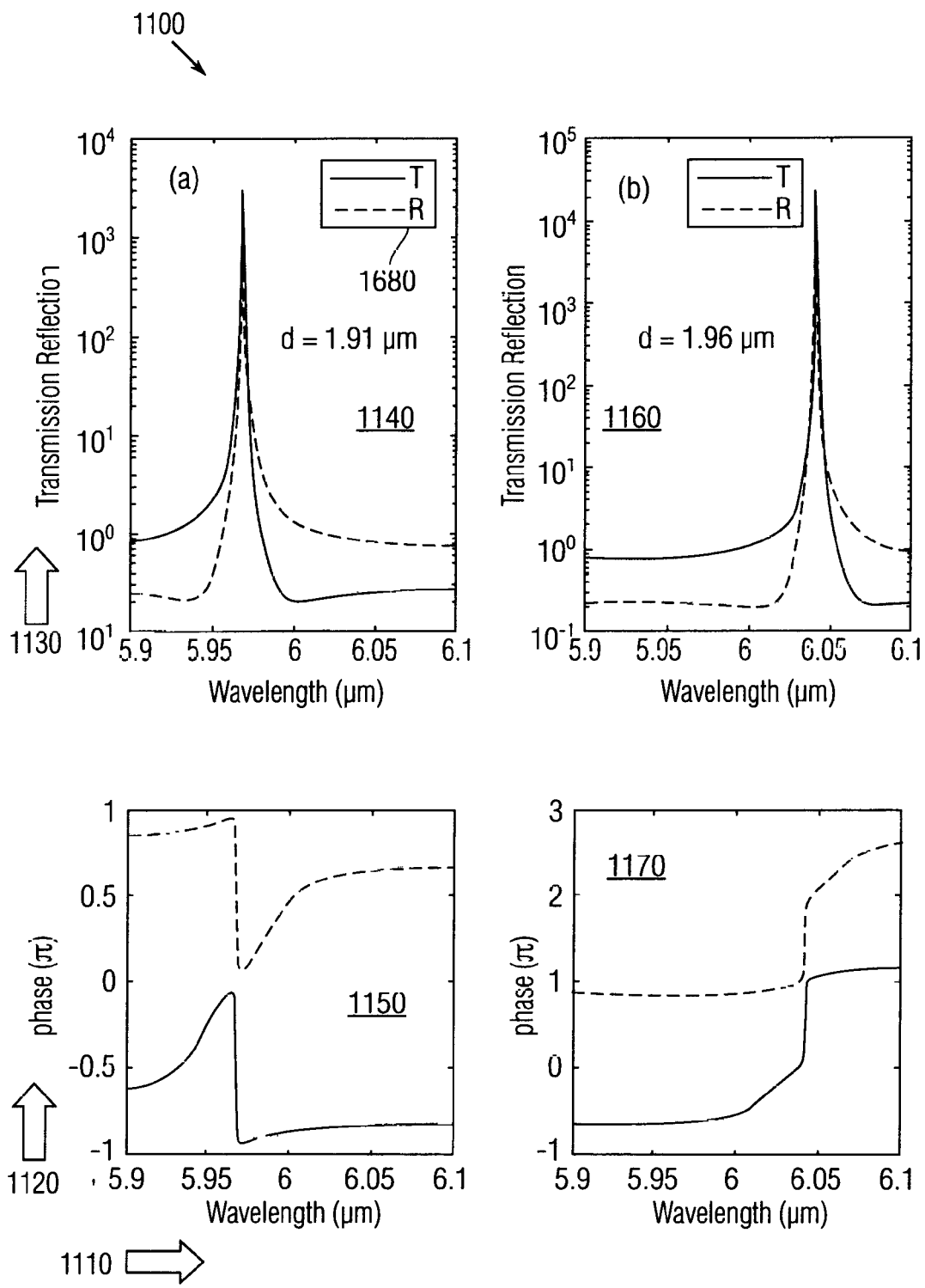
FIG. 11 is a graphical view of tuning performance of the device.

FIG. 11 shows a graphical view 1100 of reflectance and transmittance variation in amplitude and phase with wavelength for two example thickness values. The abscissa 1110 denotes wavelength (micrometers) for all four panels, the first ordinate 1120 denotes phase for the lower panels, and the second ordinate 1130 denotes amplitudes for the upper panels. The upper left panel 1140 provides transmittance and reflectance variation curves (solid and dash respectively) for thickness of 1.91 µm. The lower left panel 1150 provides phase variation accordingly. Similarly, the upper right panel 1160 provides analogous amplitude variation curves in transmittance and for thickness of 1.96 µm. Also, the lower right panel 1170 provides phase accordingly.

Legend 1180 identifies the transmittance and reflectance curves for all four panels. For both transmittance and reflectance at 1.91 µm thickness in panels 1140 and 1150, the peak amplitude and phase inflection occur at wavelength of 5.97 µm. For both transmittance and reflectance at 1.96 µm thickness in panels 1160 and 1170, the peak amplitude and phase inflection occur at wavelength of 6.04 µm. This shows complementary adjustment of highly detectable shifts with thickness and wavelength.

Figure 12:
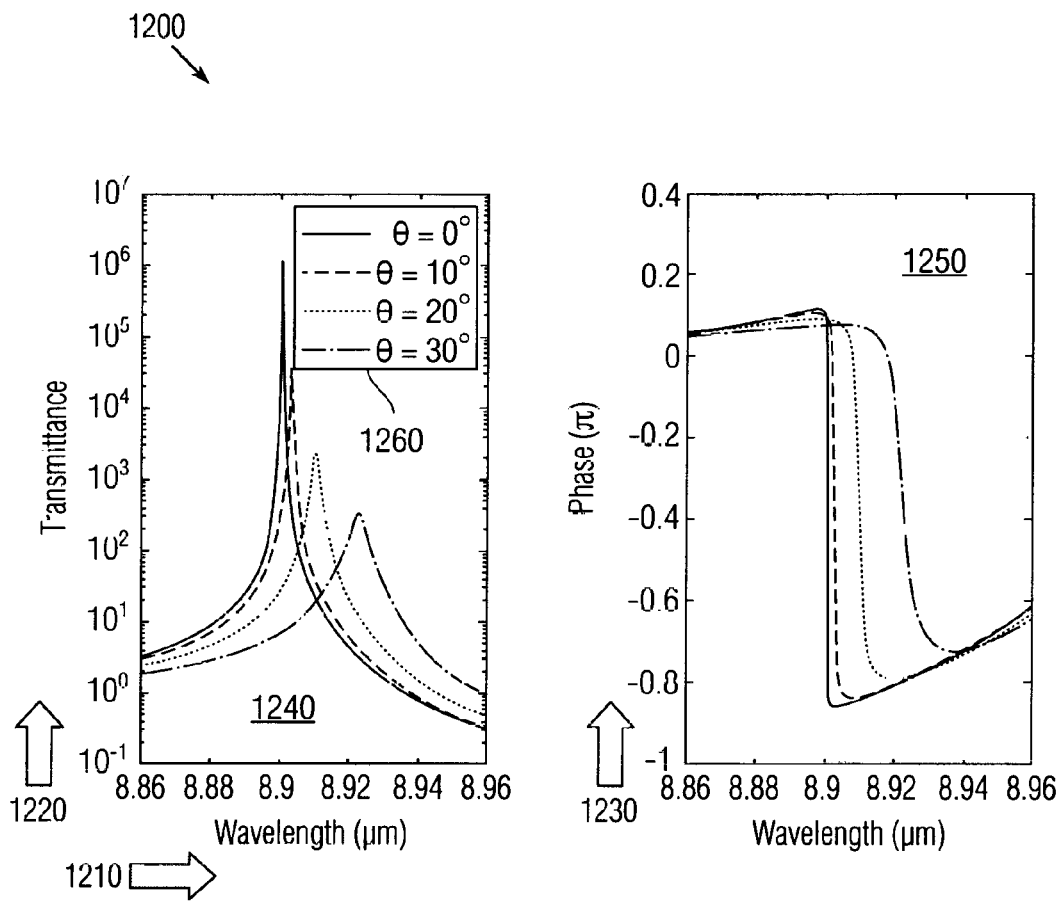
FIG. 12 is a graphical view of device performance with incident angle.

FIG. 12 shows a graphical view 1200 of transmittance amplitude and electric field phase variations of a p-polarized wave with wavelength for different incident angles at thickness d=1.50 µm and separation distance Δx=0.5 µm. The abscissa 1210 denotes wavelength (micrometers), the first ordinate 1220 denotes amplitude, and the second ordinate 1230 denotes phase for transmittance. The left panel 1240 provides amplitude variance, while the right panel 1250 presents phase, with a legend 1260 identifying the incident angles θ at 0°, 10°, 20° and 30° from normal to the incident surface. These results show decreasing peak amplitude and wider phase inflections at increasing corresponding wavelengths as incident angle increases.

Figure 13:
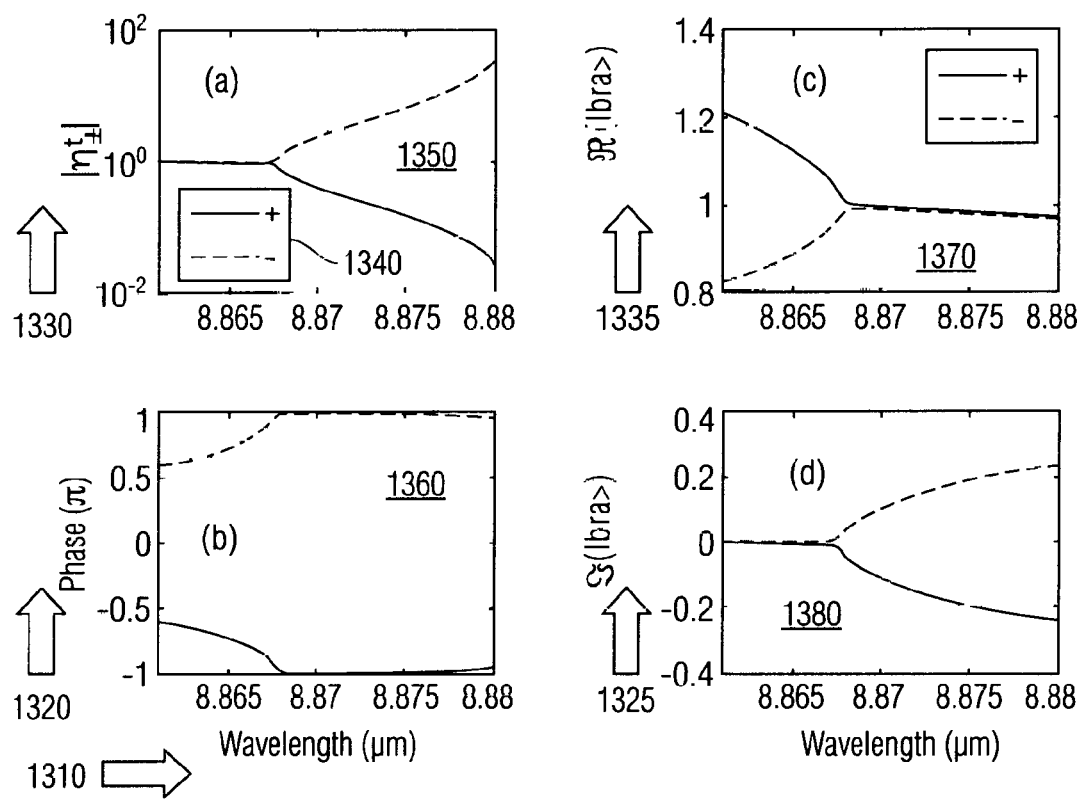
FIG. 13 is a graphical view of eigenvalues and eigenfunctions with wavelength.

FIG. 13 shows a graphical view 1300 of transfer matrix eigenvalues and eigen-functions variation with wavelength at thickness d=1.50 µm. The abscissa 1310 denotes wavelength (micrometers), the first ordinate 1320 denotes phase in multiples of π, the second ordinate 1325 denotes the imaginary component $\Im$ of the left eigen-function from eqn. (24), the third ordinate denotes absolute value of the transfer eigenvalues and the fourth ordinate denotes the real component $\Re$ of the left eigen-function. A legend 1340 identifies the curves representing the two eigenvalues (solid and dash respectively) given by eqn. (16), where the label "+" corresponds to the plus sign in front of the square root of eqn. (16), whereas the label "−" responds to the minus sign in front of the square roof of eqn. (16). The upper left panel 1350 denotes the absolute value of the eigenvalues. The lower left panel 1360 denotes the phase of the eigenvalues. The upper right panel 1370 provides the real value, while the lower right panel 1380 provides the imaginary values of the transfer eigen-functions. Bifurcations denote the exception points, which occur at the wavelength of 8.866 µm.

Figure 14:
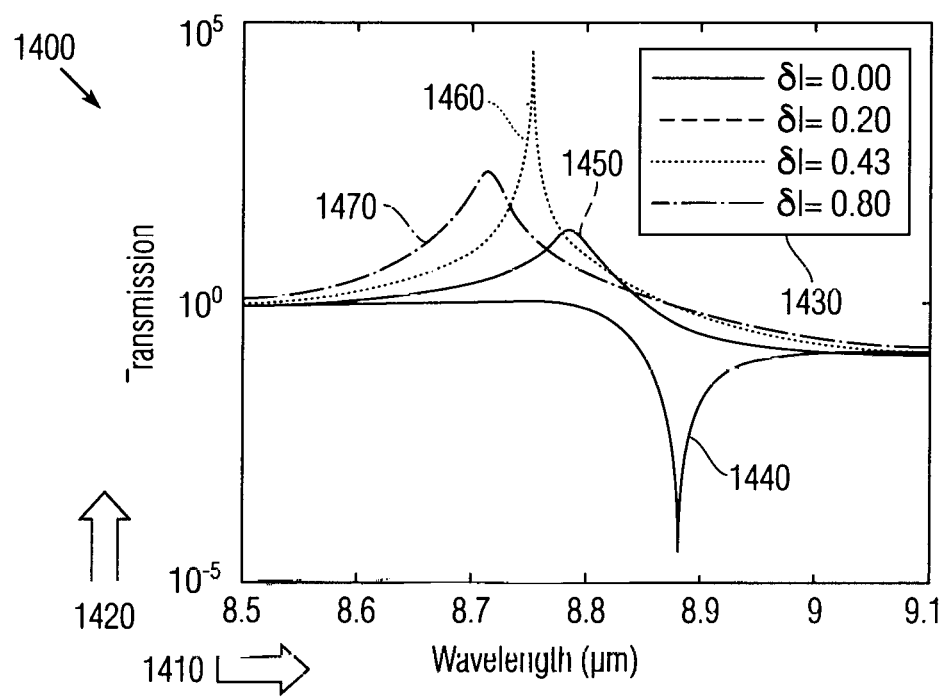
FIG. 14 is a graphical view of transmission with wavelength variation for different dimer losses.

FIG. 14 shows a graphical view 1400 of transmittance variation with wavelength near the exception point to demonstrate the device function of the loss-induced lasing or super-scattering. The curves are plotted for various dimer losses and fixed gain of $\in_g$=3.6(1−i0.06), in the absence of substrate dissipation and thickness of 1.50 µm. The abscissa 1410 denotes wavelength (micrometers) and the ordinate 1420 denotes transmittance amplitude. A legend 1430 identifies the curves 1440, 1450, 1460 and 1470 for dimer loss variation $\delta_l$ respectively as values of 0.0, 0.20, 0.43 and 0.80. These losses can be expressed as $\in_l$=3.6(1+i0.06+i$\delta_l$). The curve 1440 corresponds to balanced loss and gain where lasing does not occur as a consequence of a negative cusp for amplitude. The transmission increases with increasing loss until reaching a maximum at $\delta_l$=0.43 for curve 1460 before decreasing again. The loss-induced lasing can occur at dimer loss variation of 0.43, which demonstrates the maximum transmittance amplitude.

Figure 15:
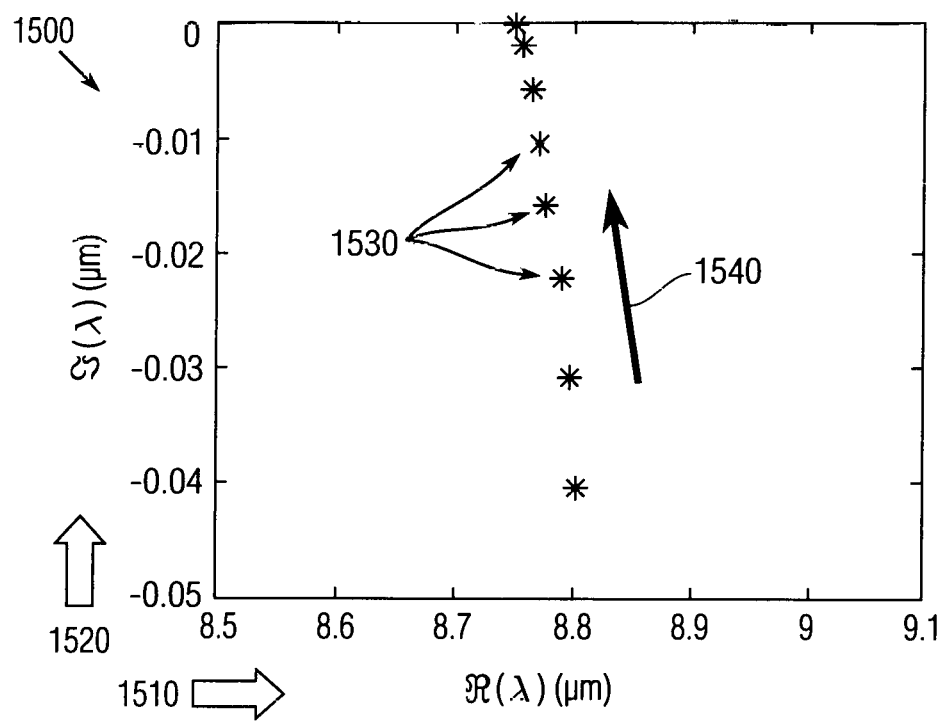
FIG. 15 is a graphical view of scattering matrix pole movement.

FIG. 15 shows a graphical view 1500 of pole movement of the scattering matrix in the complex wavelength plane. The abscissa 1510 denotes the real component $\Re(\lambda)$ of the wavelength (micrometers), and the ordinate 1520 denotes the imaginary component $\Im(\lambda)$ of the wavelength (micrometers). The points 1530 mark the loss of dimers $\delta_l$ for values of 0.1, 0.15, 0.2, 0.25, 0.3, 0.35, 0.4 and 0.43 with a fixed gain. The arrow 1540 indicates the direction of increase of the dimer loss. The real wavelength component decreases slightly from 8.80 µm at dimer loss of 0.1 to 8.75 µm at dimer loss of 0.43 that corresponds to the imaginary component vanishing, thereby leaving only the real component for the wavelength to enable lasing to occur.

Figure 16:
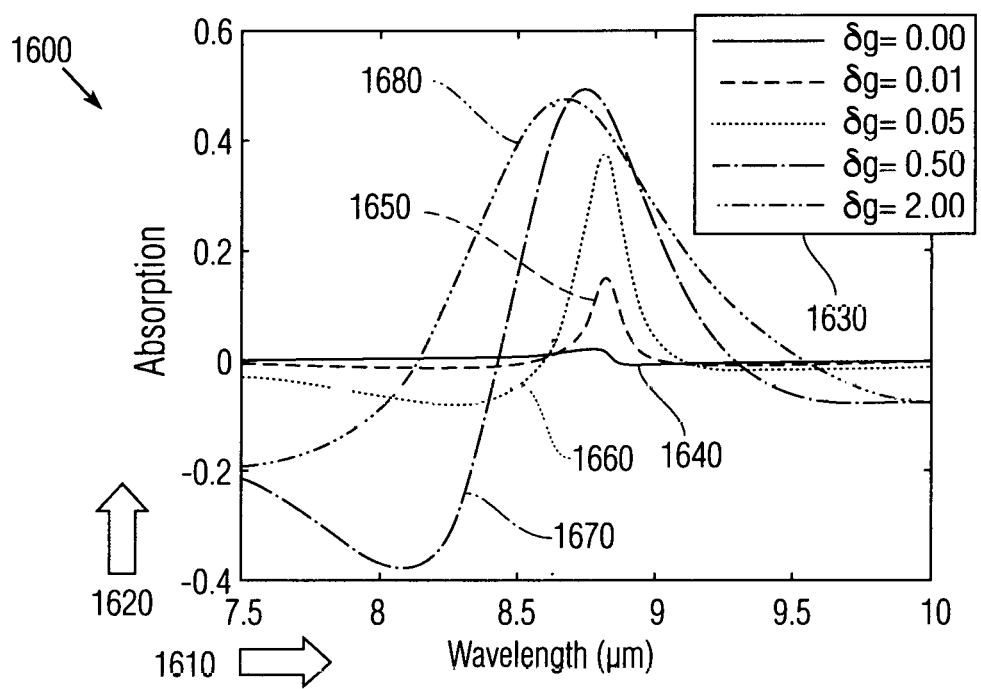
FIG. 16 is a graphical view of gain-controlled infrared absorption.

FIG. 16 shows a graphical view 1600 of infrared absorption near the exceptional point for different gain values, demonstrating the device function of gain-induced absorption and bandwidth. Here, the dimer loss is fixed at $\in_l$=3.6 (1+i0.06), whereas the permittivity of gain is $\in_g$=3.6(1−i0.06−i$\delta_l$) in the absence of substrate dissipation and thickness of 1.50 µm. The abscissa 1610 denotes wavelength (micrometers) and the ordinate 1620 denotes absorption. A legend 1630 identifies the curves 1640, 1650, 1660, 1670 and 1680 for dimer gain variation $\delta_g$ respectively as values of 0.0, 0.01, 0.05, 0.50 and 2.00. The curve 1640 corresponds to minimal absorption response. Negative absorption represents regions of amplification. The absorption increases with increasing gain until reaching a maximum at $\delta_g$=0.50 for curve 1670 before decreasing again. Both absorption peak and bandwidth increase when increasing the gain. Further increasing the gain beyond maximum absorption reduces the peak while continuing to increase the bandwidth.

Figure 17:
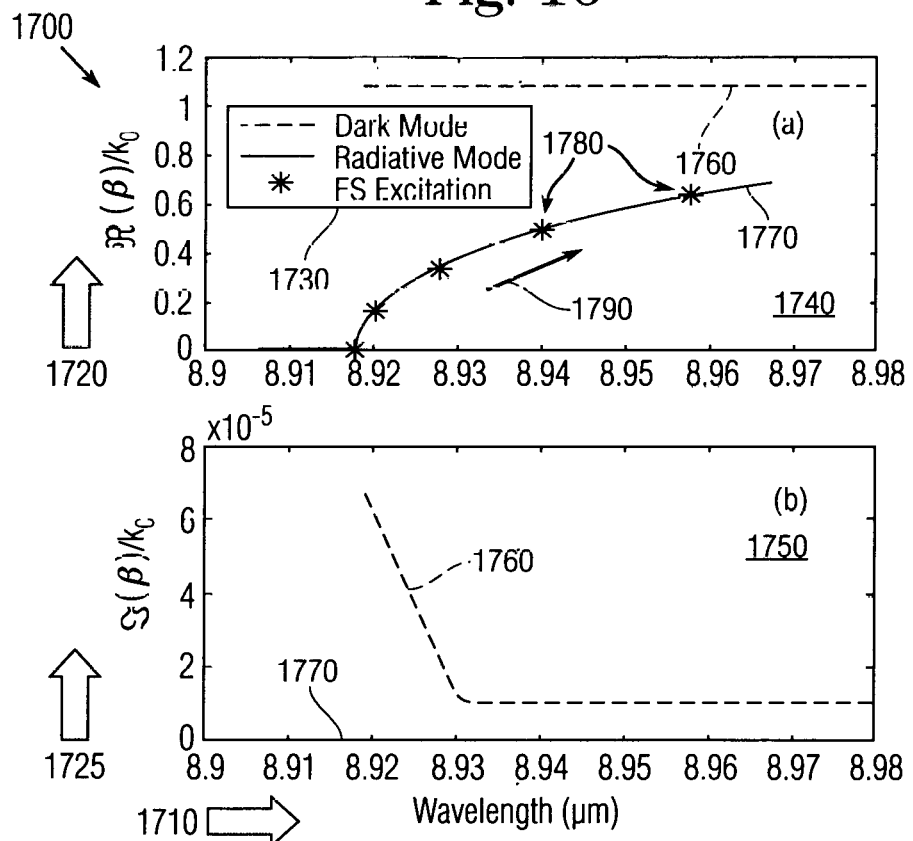
FIG. 17 is a graphical view of metafilm mode properties.

FIG. 17 shows a graphical view 1700 of metafilm mode property variation with wavelength. The abscissa 1710 denotes wavelength (micrometers), the first ordinate 1720 denotes the real component $\Re(\beta)/k_0$ of the normalized propagation constant β, and the second ordinate 1725 denotes the imaginary component $\Im(\beta)/k_0$ of that normalized component. A legend 1730 for the respective upper and lower panels 1740 and 1750 identifies the dark mode 1760 (dash line), radiation mode 1770 (solid line), and points 1780 of free space excitation. An arrow 1790 denotes the direction of increasing polar angle. Dark mode 1760 represents propagation without substrate dissipation, while radiation mode 1770 represents propagation with such dissipation. The imaginary portion reduces to a low constant value at 8.93 µm, and the real portion increases from zero beginning at wavelength of 8.917 µm and increasing asymptotically towards a plateau.

Super-scattering: View 300 in FIG. 3 shows the transmittance (T) and reflectance (R) of a normal incident electromagnetic wave onto a lossless metafilm 120 with lossless dimers 150. The frequency dependent permittivity of Al was taken from the real part of Drude model given by eqn. (4). In the lossless case, T+R=1 (energy conservation), which is clearly demonstrated in FIG. 3. An increase of the transmission is accompanied by a decrease of the reflection and vice versa. The peaks and valleys of the transmittance and the reflectance repeat periodically with the variation of the thickness of the film. The metafilm 120 behaves effectively like a low-Q Fabry-Pérot cavity below 9 µm. The upper and lower surfaces of the metafilm 120 serve as the reflection mirrors of the Fabry-Pérot cavity, while the thickness of the metafilm serves as the length of the cavity. Above 12 µm, the metafilm 120 behaves towards a perfect electric conductor (PEC).

The EM scattering is investigated from a plasmonic thin-film having balanced gain/loss elements. The $\mathcal{PT}$-synthetic plasmonic metafilm 120 no longer behaves as a Fabry-Pérot cavity. To demonstrate the effect of the substrate dissipation, the transmittance and reflectance of the metafilm 120 is investigated with and without plasmonic dissipation in the presence of the balanced gain/loss dimers 150. The upper left panel in FIG. 4 shows the transmittance and reflectance of the EM wave normally incident on the $\mathcal{PT}$-synthetic lossless plasmonic metafilm 120 of which the dispersion is given by the real part of Drude model in eqn. (4). The relative permittivity of the loss/gain dimers 150 is given by $\in_r=3.6(1\pm i0.06)$.

Clearly, the sum of the transmittance and reflectance is close to unity, i.e., T+R=1. Overall the metafilm 120 performs as a conventional lossless medium where the maximum transmission is accompanied by the minimum reflection, and vice versa. This behavior can be understood as the sub-wavelength dimers 150 have balanced gain/loss profile and are embedded in the metafilm 120 as a lossless substrate 220.

The situation changes dramatically when the plasmonic substrate dissipation is taken into account as shown in the upper right panel of FIG. 4 where the giant transmittance and reflectance occur at the same wavelength, unlike conventional media where one increases at the expense of the other. This peculiar property can be analyzed through the scattering parameters $S_{11}$ and $S_{21}$ that have a common denominator $M_{11}$ as shown by eqns. (12) and (13).

When the denominator of $S_{11}$ and $S_{21}$ vanishes, both transmittance and reflectance approach infinity as long as $M_{21}$ is finite. The lower panels 450 and 470 in FIG. 4 show the magnitude of $M_{11}$ and $M_{21}$ with and without the substrate dissipation described by the Drude model in eqn. (4). Without the substrate dissipation in the lower left panel 450, both magnitude of $M_{11}$ and $M_{21}$ are large at the wavelength about 8.88 μm, which explains the null in the transmittance and the peak in the reflectance in the upper left panel 440. Upon activation of substrate dissipation in the lower right panel 470, the magnitude $|M_{11}|$ vanishes at the wavelength about 8.92 μm, whereas the magnitude $|M_{21}|$ is finite. Thus, both transmission and reflection approach infinity.

Here, the spectral singularities are manifested as the dissipation-induced super-scattering. This dissipation-induced super-scattering is also observed when varying the thickness of the metafilm 120 at the fixed wavelength $\lambda=6$ μm as illustrated in the upper panels 540 and 560 of FIG. 5 with the corresponding analysis of the transfer matrix elements given in the lower panels 550 and 570 of FIG. 5.

Without the substrate dissipation, the metafilm 120 behaves as a conventional medium, where the peak of the transmittance is accompanied by the valley of the reflectance and vice versa in the upper left panel 540. The production of gain and loss is balanced. The plasmonic substrate dissipation induces over-production of gain, leading to super-scattering in both forward and backward directions in the upper right panel 560. As shown in the lower right panel 570 of FIG. 5, the singular behavior is related to the vanishing of the transfer matrix element $M_{11}$ (solid), the common denominator of $S_{11}$ and $S_{21}$.

The spectral singularity and the associated giant scattering is a signature of non-Hermitian Hamiltonian of the gain medium. From eqn. (18), when $M_{11} \to 0$, the scatter eigenvalue above unity diverges and the scatter eigenvalue below unity remains finite, i.e., $$\eta_+^s \to \infty, \text{ and } \eta_-^s \to -\frac{M_{22}}{2}. \tag{24}$$

This singularity is demonstrated as view 600 in FIG. 6. Here, the scattering eigenvalues are displayed in the solid curve 650 in the upper left panel, and the transfer eigenvalues are displayed in the solid curve 670 in the upper right panel. A similar singularity is shown for matrices with the simulation condition corresponding to that of view 400 in FIG. 4. There is also a phase jump for the diverged eigenvalue, shown as the solid curve in the lower left panel 450. The eigenvalues of the transfer matrix satisfy the condition $|\eta_+^t \eta_-^t|=1$ from eqn. (18) with one magnitude greater than unity and the other less than unity, corresponding to the amplification and decay modes, respectively.

The relationship $|\eta_+^t \eta_-^t|=1$ from eqn. (18) has been tested for various parameters with and without the substrate dissipation. Unlike the zero-bandwidth resonance in the longitudinal $\mathcal{PT}$-symmetric structures, the super-scattering in this geometry with the transverse local $\mathcal{PT}$-symmetry has a finite bandwidth, which is easier to demonstrate experimentally and opens up various potential applications.

The coexistence of super transmission and reflection is a manifestation of the resonant state of the complex scattering potential, one of the essential features of non-Hermitian Hamiltonian with gain. This phenomenon is fundamentally different from the geometric related resonances. The spectral singularity-induced resonance resides in a localized region of a multidimensional parameter space of the system as implied in FIGS. 7 and 9, which show the super-scattering respectively at the wavelength 8.92 μm and at the thickness of 1.927 μm versus the geometric parameters and the loss tangents of the metal substrate and dimers. At the super-scattering, the transmitted and reflected electric fields experience a π-phase shift across the singularity as shown in FIGS. 8 and 10 for the respectively specified wavelength and thickness.

FIG. 12 demonstrates the giant transmittance and the corresponding phase shift of the electric field at different (polar) angles of incidence. The transmittance decreases with the increase of the incidence angle. Similar behavior occurs for the reflectance (not shown). FIG. 11 shows tuning the resonant frequency of the super-scattering and the corresponding phase jump of the transmitted and reflected electric fields when varying the thickness of the mesh while keeping other parameters unchanged.

Adding the substrate dissipation is equivalent to introducing loss into the cavity. The dissipation provides a coupling mechanism for the spaser to radiate into the far field. Without the dissipation, the $\mathcal{PT}$-spaser cannot lase and behaves as a lossless thin film. The spaser generates strong coherent local field, but the photons are trapped inside the dark modes which cannot radiate without a proper coupling mechanism. Here the loss is introduced into the cavity as metallic dissipation, which naturally enters the plasmonic dark modes and turns them into radiative modes, and thus releases the trapped photons.

The top and bottom surfaces of the metafilm 120 provide the required feedback for lasing. This feedback mechanism is observable from FIG. 3 that shows the Fabry-Pérot cavity effect. The metafilm 120 as a whole functions as a high-quality active resonator. The $\mathcal{PT}$-spaser is coupled to the far field through transforming dark modes into radiative modes by metallic dissipation of the metafilm 120.

Numerical studies indicate that super-scattering occurs in the vicinity of an exceptional point (EP). In the absence of substrate dissipation, the metafilm 120 satisfies 𝒫𝒯-symmetry with balanced gain and loss arranged in the anti-symmetric distribution of the imaginary portion of the permittivity. The two eigenstates are forward and backward waves. Their constructive and destructive interferences modify transmission and reflection, as well as lasing and absorption. An EP is characterized by coalescence of both eigenvalues and associated eigenvectors, thereby reducing the system to one dimension. FIG. 13 exemplifies wavelength variation of the eigenvalues and associated eigenfunctions in the neighborhood of the EP, indicated by the bifurcation point at wavelength $\lambda=8.968$ µm, where both eigen-parameters coalesce.

The presence of such an EP can have a dramatic effect on the EM property of the system. Around the EP, lasing can be induced either by adding substrate dissipation, or else by increasing the loss of the dimers 150 without adding the substrate dissipation. The former effect of adding substrate dissipation effect is shown in FIGS. 4 and 5. The latter effect of increasing the dimer loss is shown in FIG. 14 for the transmission coefficient at different dimer losses with a fixed gain. The transmission increases with increasing loss until reaching a maximum where lasing occurs at a loss of $\delta_l=0.43$.

The corresponding poles of a scattering matrix in a complex wavelength plane is shown in FIG. 15 for different losses of the dimers 150. Increasing the loss moves the pole up towards the real axis. Lasing occurs when the pole reaches the real axis, i.e., $\Im(\lambda)=0$. In a similar vein, gain-induced infrared absorption around the EP is shown in FIG. 16 by varying gain of the dimers 150 with a fixed loss. The numerical study indicates that maximum absorption can be achieved for a gain at $\delta_g=0.5$. Negative absorption can result from the net gain.

Without substrate dissipation, the sum of transmittance and reflectance remains unity, and the net amplification is zero in the output signals. The periodic dimers 150 provide an array of twin resonators on the metafilm 120 that serves as the substrate. An incident wave with the electric field E parallel to the short edge of the rectangular elements that can excite a localized cavity mode inside the element. The 𝒫𝒯-synthetic design sustains a localized gain-type plasmon and loss-type plasmon within a unit cell. The substrate dissipation can modify the waveguide mode of the substrate and transform the dark mode of the substrate into the radiative mode as shown in FIG. 17. Hence the dissipation provides a mechanism to couple light out of the system, and the 𝒫𝒯-synthetic medium behaves as a planar source of coherent radiation. These elements as dimers 150 can constitute holes in the metafilm 120.

An array of sub-wavelength holes in the metallic substrate, i.e., metafilm 120, supports surface plasmon resonances. FIG. 17 shows the real and imaginary portions of the normalized mode propagation constant in the absence of dissipation. This shows a complex propagation constant as dash lines 1780 with the effective mode index greater than unity, and thus cannot be accessed from the free space. Therefore, the photons are trapped in the dark mode. When adding substrate dissipation, the mode propagation constant becomes real and less than unity shown by the solid lines 1770. This mode can be excited by a free space plane wave. Consequently, when this mode is lased, the structure 110 will radiate into the far field. The dark mode of the metafilm 120 in the absence of the dissipation becomes the radiative mode, which can couple to the external field, in the presence of the dissipation. The points 1780 coincide with the radiative branch lines 1770 indicating that super-scattering results from exciting and lasing to the radiative plasmonic mode. This radiative branch can be accessed by a free space plane wave, such as for transmission as a function of wavelength for different incident angles, as shown for similar conditions in FIG. 12.

Substrate dissipation provides a technique to couple radiation of the 𝒫𝒯-synthetic metafilm 120 into the far field. With super-scattering, the transmitted and reflected electric field experiences a phase shift, which is typical behavior at the resonance. In the absence of dissipation, the photons remain trapped in the dark modes that cannot radiate without a proper coupling mechanism. The substrate dissipation breaks the 𝒫𝒯-symmetry and transforms the dark mode into the radiative mode so as to couple the light out of the metafilm 120 to release the trapped photons.

The EP related phenomena, such as resonant frequency, are sensitive to the parameters of these systems. Therefore, the EP offers a preferred mechanism for low-threshold or fast switch. This can be applied to an ultra-sensitive sensor to detect small variation of the parameter. The upper panels 1140 and 1160 in FIG. 11 show transmission and reflection of the normally incident wave at different thicknesses of the metafilm 120. The lasing frequency can be tuned by a small variation of the thickness while maintaining other parameters unchanged.

The interplay between loss and gain can enable loss-induced lasing and gain-induced absorption in the 𝒫𝒯-synthetic plasmonic metafilm 120 near the EP. The super-scattering has a finite bandwidth that increases the possibility of detecting resonance related to a spectral singularity. The scattering property of an optical system can be controlled by background dissipation. Adding substrate dissipation is equivalent to introducing loss into a cavity. Exemplary embodiments provide a strategy to control the phase of 𝒫𝒯-symmetry using background loss and to control the radiation of the dimer 150 using cavity dissipation. The effect of introducing gain into materials provides more than loss compensation. The interplay between loss and gain can transform the 𝒫𝒯-synthetic metafilm 120 into a laser or absorber. This exemplary device can also be designed as a laser absorber switch.

This disclosure demonstrates a new type of plasmonic laser and absorber based on the 𝒫𝒯-symmetry, lasing 𝒫𝒯-spaser and gain-induced absorber. The super-scattering has a finite bandwidth that increases the detection possibility for spectral singularity related resonances. The exemplary result implies that the scattering properties of optical systems may be controlled by the background dissipation, and thereby provides a new strategy to control the phase of the 𝒫𝒯-symmetry using the background loss, and to control the super radiation from a cavity by tuning the cavity dissipation.

The effect of introducing gain into materials is more than loss compensation. The interplay between the loss and gain surface plasmons in the dimers 150 leads to the meta-gain atoms (𝒫𝒯-surface plasmon-dimers), which transform the 𝒫𝒯-synthetic metafilm 120 into a meta-gain medium. The exemplary embodiments exhibiting effective responses demonstrate capabilities of practical 𝒫𝒯-synthetic materials. The π-phase jump of the electric field at the super-scattering can be used to design a two-state system, a new modulation scheme, and potentially manipulating light in free space using the concept of 𝒫𝒯-symmetry. The narrow-band resonant thin-films enable applications in designs for notch filter, sensor, and optical switch.

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true spirit of the embodiments.

What is claimed is:

1. A metafilm for loss-induced super-scattering of a photon at a wavelength, comprising:
    an electrically conductive substrate having a planar surface, a sub-wavelength thickness and a first complex permittivity; and
    a plurality of dimers disposed in a planar array on said planar surface of said substrate, each dimer having a sub-wavelength period and including loss and gain elements separated by a sub-wavelength distance, each element having a sub-wavelength span and a sub-wavelength width along said planar array, said loss element having a second complex permittivity, said gain element having a third complex permittivity, wherein
    said first, second and third complex permittivities respectively include first, second and third real components, and respectively include first, second and third imaginary components,
    said second and third real components are equal,
    said second imaginary component is higher than said third imaginary component, and
    the metafilm emits the photon in response to increasing one of said first imaginary component and said second imaginary component.

2. The metafilm according to claim 1, wherein absent stimulus said third imaginary component for said gain element is the negative of said second imaginary component for said loss element.

3. The metafilm according to claim 1, wherein said loss element is one of a natural dielectric material and a composite dielectric material.

4. The metafilm according to claim 1, wherein said gain element is one of a quantum dot and a quantum well.

5. The metafilm coating according to claim 1, wherein said gain element is one of a semiconductor material and a fluorescent material.

6. The metafilm coating according to claim 1, wherein said conductive substrate is composed of one of aluminum, gold, silver, copper palladium and tungsten.

7. The metafilm coating according to claim 1, wherein said conductive substrate is a composite transparent conductive material.

8. The metafilm coating according to claim 1, wherein super-scattering produces a lasing effect.

9. A metafilm for gain-induced absorption of a photon at a wavelength, comprising:
    an electrically conductive substrate having a planar surface, a sub-wavelength thickness and a first complex permittivity; and
    a plurality of dimers disposed in a planar array on said planar surface of said substrate, each dimer having a sub-wavelength period and including loss and gain elements separated by a sub-wavelength distance, each element having a sub-wavelength span and a sub-wavelength width along said planar array, said loss element having a second complex permittivity, said gain element having a third complex permittivity, wherein
    said first, second and third complex permittivities respectively include first, second and third real components, and respectively include first, second and third imaginary components,
    said second and third real components are equal,
    said second imaginary component is higher than said third imaginary component, and
    the metafilm absorbs the photon in response to increasing said third imaginary component.

10. The metafilm according to claim 9, wherein absent stimulus said third imaginary component for said gain element is the negative of said second imaginary component for said loss element.

11. The metafilm according to claim 9, wherein said loss element is one of a natural dielectric material and a composite dielectric material.

12. The metafilm according to claim 9, wherein said gain element is one of a quantum dot and a quantum well.

13. The metafilm coating according to claim 9, wherein said gain element is one of a semiconductor material and a fluorescent material.

14. The metafilm coating according to claim 9, wherein said conductive substrate is composed of one of aluminum, gold, silver, copper palladium and tungsten.

15. The metafilm coating according to claim 9, wherein said conductive substrate is a composite transparent conductive material.

16. A metafilm for switching operations with a photon at a wavelength, comprising:
    an electrically conductive substrate having a planar surface, a sub-wavelength thickness and a first complex permittivity; and
    a plurality of dimers disposed in a planar array on said planar surface of said substrate, each dimer having a sub-wavelength period and including loss and gain elements separated by a sub-wavelength distance, each element having a sub-wavelength span and a sub-wavelength width along said planar array, said loss element having a second complex permittivity, said gain element having a third complex permittivity, wherein
    said first, second and third complex permittivities respectively include first, second and third real components, and respectively include first, second and third imaginary components,
    said second and third real components are equal,
    said second imaginary component is higher than said third imaginary component,
    the metafilm switches from release of the photon to absorption of the photon by increasing said third imaginary component, and
    the metafilm switches from absorption of the photon to release of the photon by increasing said second imaginary component.

17. The metafilm according to claim 16, wherein absent stimulus said third imaginary component for said gain element is the negative of said second imaginary component for said loss element.

18. The metafilm according to claim 16, wherein said loss element is one of a natural dielectric material and a composite dielectric material.

19. The metafilm according to claim 16, wherein said gain element is one of a quantum dot and a quantum well.

20. The metafilm coating according to claim 16, wherein said gain element is one of a semiconductor material and a fluorescent material.

21. The metafilm coating according to claim 16, wherein said conductive substrate is composed of one of aluminum, gold, silver, copper palladium and tungsten.

22. The metafilm coating according to claim 16, wherein said conductive substrate is a composite transparent conductive material.

* * * * *